(12) United States Patent
Otose

(10) Patent No.: US 11,848,063 B2
(45) Date of Patent: Dec. 19, 2023

(54) CIRCUIT CONFIGURED TO OUTPUT OUTPUT SIGNAL AND SHIFT REGISTER

(71) Applicant: XIAMEN TIANMA DISPLAY TECHNOLOGY CO., LTD., Xiamen (CN)

(72) Inventor: Tomohiko Otose, Kanagawa (JP)

(73) Assignee: XIAMEN TIANMA DISPLAY TECHNOLOGY CO., LTD, Xiamen (CN)

( * ) Notice: Subject to any disclaimer, the term of this patent is extended or adjusted under 35 U.S.C. 154(b) by 0 days.

(21) Appl. No.: 17/746,235

(22) Filed: May 17, 2022

(65) Prior Publication Data
US 2022/0375535 A1  Nov. 24, 2022

(30) Foreign Application Priority Data

May 18, 2021 (JP) ................................. 2021-083961
Feb. 22, 2022 (JP) ................................. 2022-025893

(51) Int. Cl.
| | | |
|---|---|---|
| G11C 19/00 | (2006.01) | |
| G11C 19/28 | (2006.01) | |
| G09G 3/20 | (2006.01) | |
| G09G 3/3233 | (2016.01) | |

(52) U.S. Cl.
CPC ............... *G11C 19/28* (2013.01); *G09G 3/20* (2013.01); *G09G 3/3233* (2013.01); *G09G 2300/0842* (2013.01); *G09G 2310/0286* (2013.01); *G09G 2310/0297* (2013.01); *G09G 2310/08* (2013.01)

(58) Field of Classification Search
CPC ........... G11C 19/28; G09G 2310/0286; G09G 3/3233; G09G 2300/0842
See application file for complete search history.

(56) References Cited

U.S. PATENT DOCUMENTS

| | | | |
|---|---|---|---|
| 10,319,283 B2 * | 6/2019 | Kim ........................ | G11C 19/28 |
| 2003/0173995 A1 | 9/2003 | Cairns et al. | |
| 2005/0275607 A1 * | 12/2005 | Tobita ................... | G09G 3/3283 |
| | | | 345/76 |
| 2010/0176395 A1 | 7/2010 | Choi et al. | |
| 2014/0055334 A1 * | 2/2014 | Qing ....................... | G11C 19/28 |
| | | | 377/64 |
| 2014/0313174 A1 * | 10/2014 | Murakami ............. | G11C 19/28 |
| | | | 377/80 |

(Continued)

*Primary Examiner* — Tuan T Lam
(74) *Attorney, Agent, or Firm* — NIXON & VANDERHYE

(57) ABSTRACT

A circuit includes a first output signal supply line, a second output signal supply line, an output line, a first p-type thin-film transistor disposed between the first output signal supply line and the output line an n-type thin-film transistor disposed between the second output signal supply line and the output line, and a second p-type thin-film transistor disposed between the second output signal supply line and the output line. The n-type thin-film transistor and the second p-type thin-film transistor are configured to be OFF to output a signal on the first output signal supply line to the output line when the first p-type thin-film transistor is ON. The first p-type thin-film transistor is configured to be OFF to supply a signal on the second output signal supply line to the output line when the n-type thin-film transistor and the second p-type thin-film transistor are ON.

16 Claims, 18 Drawing Sheets

(56) References Cited

U.S. PATENT DOCUMENTS

| | | | |
|---|---|---|---|
| 2017/0148392 A1* | 5/2017 | Kim | G09G 3/3677 |
| 2017/0178559 A1* | 6/2017 | Kim | G09G 3/20 |
| 2017/0178560 A1* | 6/2017 | Lee | G09G 3/3677 |
| 2017/0365220 A1* | 12/2017 | Huang | H10K 59/1213 |
| 2019/0204968 A1 | 7/2019 | Hur et al. | |
| 2021/0150999 A1* | 5/2021 | Sasaki | G09G 3/3688 |

* cited by examiner

CIRCUIT CONFIGURED TO OUTPUT OUTPUT SIGNAL AND SHIFT REGISTER

CROSS-REFERENCE TO RELATED APPLICATIONS

This non-provisional application claims priority under 35 U.S.C. § 119(a) on Patent Application No. 2021-083961 filed in Japan on May 18, 2021 and Patent Application No. 2022-025893 filed in Japan on Feb. 22, 2022, the entire contents of which are hereby incorporated by reference.

BACKGROUND

This disclosure relates to a circuit configured to output an output signal and a shift register.

Liquid display devices (LCDs) and organic light-emitting diode (OLED) display devices are widely used as display devices. These display devices include a shift register for driving (selecting) scanning lines. Further, there are OLED display devices that measure the characteristics of elements (such as driving TFTs and OLEDs) in the display device and adjust a data signal based on the measurement results. Such OLED display devices that perform external compensation to the data signal include a shift register for outputting a control signal for the measurement.

Devices fabricated with LTPO technology in which low-temperature polysilicon (LTPS) thin-film transistors (TFTs) and oxide semiconductor TFTs such as IGZO TFTs are integrated on the same substrate have come to be applied to display panels. Moreover, the range of application of such devices is expanding.

Products including such a device can be designed to take advantages of the device characteristics, for example by using an IGZO TFT at a location where leakage current causes a problem and using an LTPS TFT at a location where high driving ability is demanded. Furthermore, the possibility of fabricating a complementary metal-oxide-semiconductor (CMOS) device by combining a PMOS type of LTPS TFT and an NMOS type of IGZO TFT is studied.

In a shift register, the potential of a node connected with the gate of the output transistor is changed to a high potential (or a low potential) in the period after data is input until the data is output. To electrically connect the node with either a high-potential power supply or a low-potential power supply all the time, the node needs to be complementarily connected to the power supplies through a complementary metal-oxide semiconductor (CMOS) including both of an n-channel transistor and a p-channel transistor. Compared to a circuit including a single conductive type of TFTs, a CMOS circuit can have a small circuit scale and high reliability.

SUMMARY

An aspect of this disclosure is a circuit configured to output an output signal from an output line. The circuit includes: a first output signal supply line; a second output signal supply line; an output line; a first p-type thin-film transistor disposed between the first output signal supply line and the output line and configured to turn ON and OFF; an n-type thin-film transistor disposed between the second output signal supply line and the output line and configured to turn ON and OFF; and a second p-type thin-film transistor disposed between the second output signal supply line and the output line and configured to turn ON and OFF. The n-type thin-film transistor and the second p-type thin-film transistor are configured to be OFF to output a signal on the first output signal supply line to the output line when the first p-type thin-film transistor is ON. The first p-type thin-film transistor is configured to be OFF to supply a signal on the second output signal supply line to the output line when the n-type thin-film transistor and the second p-type thin-film transistor are ON.

It is to be understood that both the foregoing general description and the following detailed description are exemplary and explanatory and are not restrictive of this disclosure.

EMBODIMENTS

Figure 1:
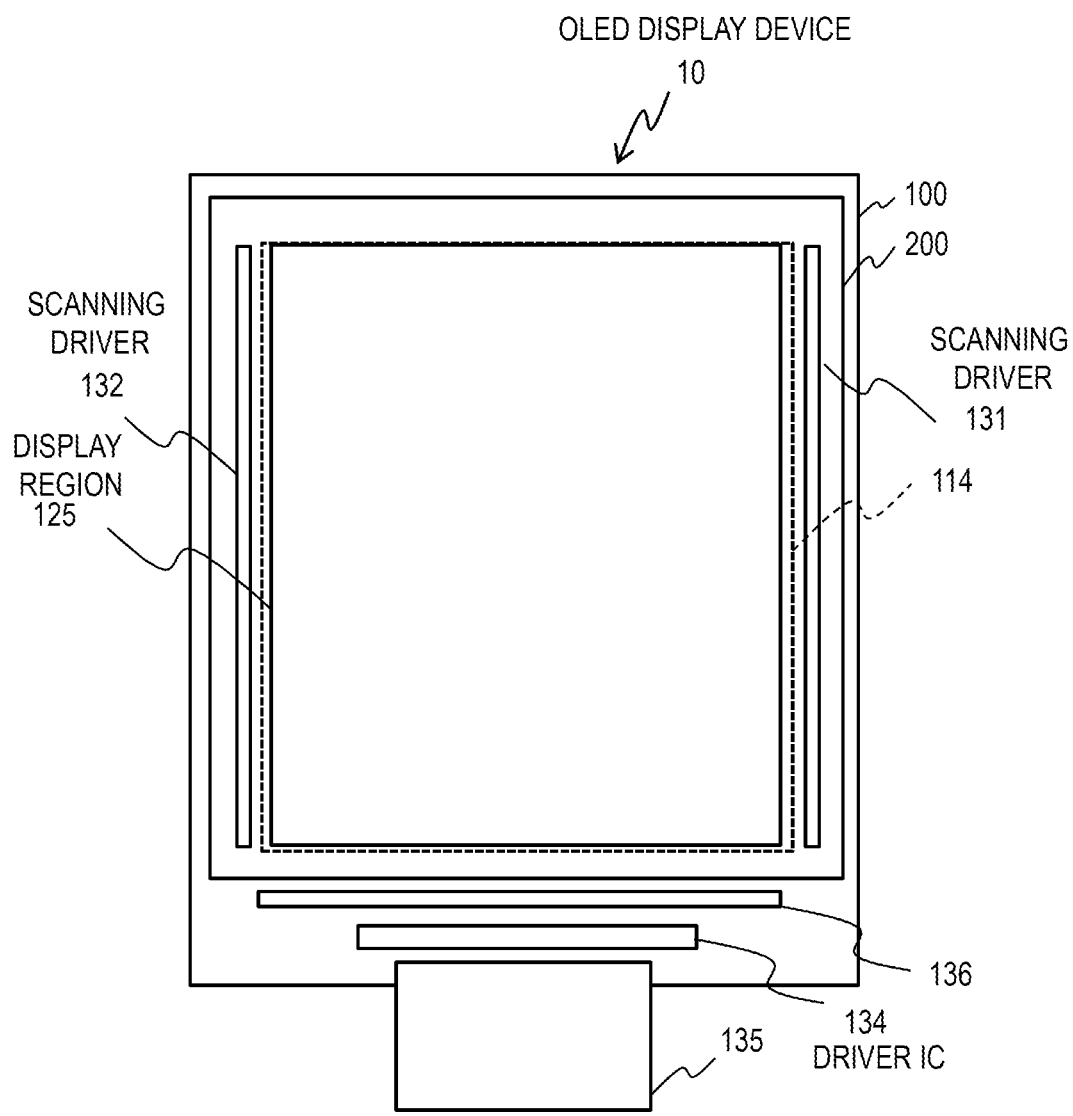
FIG. 1 schematically illustrates a configuration example of an OLED display device.

Hereinafter, embodiments of this disclosure will be described with reference to the accompanying drawings. It should be noted that the embodiments are merely examples to implement this disclosure and are not to limit the technical scope of this disclosure.

Overview

Described in the following are circuit configurations applicable to a shift register for devices such as a liquid crystal display (LCD) device and an organic light-emitting diode (OLED) display device. The circuits disclosed in the following are applicable to devices different from display devices.

A circuit in an embodiment of this specification utilizes LTPO technology for integrating low-temperature polysilicon (LTPS) thin-film transistors (TFTs) and oxide semiconductor TFTs such as IGZO TFTs. The circuit includes a complementary metal-oxide-semiconductor (CMOS) circuit configured by combining a PMOS-type (also simply referred to as p-type) LTPS TFT and an NMOS-type (also simply referred to as n-type) IGZO TFT.

A CMOS circuit attains a small circuit scale, compared to a circuit including TFTs having the same (single) conductivity only. A circuit with a single conductive type of TFTs needs to lower the gate potential of the pull-down TFT by bootstrapping in order to generate a high-voltage output signal. For the bootstrapping, a capacitor has to be provided between the gate and the source of the pull-down TFT.

Furthermore, a TFT for isolation is included to prevent the high voltage from being applied between the drain and the source of specific control TFTs in bootstrapping. These elements expand the scale of the circuit with a single conductive type of TFTs. Moreover, the electric stress applied to the TFTs could lower the reliability.

A CMOS circuit does not need bootstrapping in a circuit with a single conductive type of TFTs; the circuit elements for bootstrapping can be excluded to achieve a smaller circuit scale. However, existing CMOS circuits including a combination of an LTPS TFT and an oxide semiconductor TFT have some problems. One of them is that the oxide semiconductor TFT occupies a large area in the CMOS circuit. This is because there is a large difference in mobility between LTPS and oxide semiconductor. For example, IGZO has a mobility of approximately 1/10 of the mobility of LTPS.

Another problem is that residual charge in the output line of the CMOS circuit is difficult to leave, so that operational failure may occur in the CMOS circuit and impair the reliability. This is caused by the low leakage characteristic of the oxide semiconductor TFT. For example, an on-vehicle display device is requested to have a fail-safe function to prevent abnormal display by showing a black screen when an input signal supplied to an operating CMOS circuit becomes unstable because of unexpected variation of the power supply voltage. Since the off leakage in the oxide semiconductor TFT is small, a display defect caused by residual charge could occur.

A CMOS circuit in an embodiment of this specification includes a p-type pull-up TFT for supplying a high potential to the output line and an n-type pull-down TFT for supplying a low potential to the output line and further, includes a p-type pull-down TFT. The p-type TFTs can be LTPS TFTs and the n-type TFT can be an oxide semiconductor TFT, such as an IGZO TFT. This configuration is effective especially for a CMOS circuit in which the p-type TFTs have higher mobility than the n-type TFT and the n-type TFT generates less leakage current than the p-type TFTs. The semiconductor for the p-type TFTs can be a material other than polysilicon and the semiconductor for the n-type TFT can be a material other than oxide semiconductor.

As described above, pulling up the potential of the output line to a predetermined high level (VH) is done by the p-type pull-up TFT. The p-type pull-down TFT pulls down the potential of the output line to a potential higher than a predetermined low potential (VL) by a predetermined value, specifically, to a potential (VL+Vth) higher than the potential VL by the threshold voltage of the p-type pull-down TFT. The n-type pull-down TFT successively pulls down the potential of the output line from the potential (VL+Vth) to the predetermined potential level VL.

Since the p-type pull-down TFT lowers the potential of the output line to (VL+Vth), the n-type pull-down TFT does not require a large driving ability to pull down the potential of the output line. Accordingly, the increase in circuit area can be suppressed compared to the CMOS configuration.

Hereinafter, embodiments will be described specifically with reference to the drawings. Elements common to the drawings are denoted by the same reference signs and some elements in the drawings are exaggerated in size or shape for clear understanding of the description.

Embodiment 1

Overall Configuration

FIG. 1 schematically illustrates a configuration example of an OLED display device 10. Although the OLED display device is described by way of example of a device to which the shift register of this disclosure is applied, the shift register of this disclosure is applicable to other types of display devices and devices different from display devices. The OLED display device 10 includes a thin film transistor (TFT) substrate 100 on which OLED elements are fabricated and a structural encapsulation unit 200 for encapsulating the OLED elements.

In the periphery of a cathode electrode region 114 outer than the display region 125 of the TFT substrate 100, scanning drivers 131 and 132, a driver IC 134, and a demultiplexer 136 are provided. The first scanning driver 131 drives scanning lines on the TFT substrate 100. The second scanning driver 132 drives measurement control lines to measure the characteristics of the elements such as organic light-emitting elements and TFTs.

The driver IC 134 is connected to the external devices via flexible printed circuits (FPC) 135. The driver IC 134 is mounted with an anisotropic conductive film (ACF), for example.

The driver IC 134 provides power and timing signals (control signals) to the scanning drivers 131 and 132 and further, provides power and a data signal to the demultiplexer 136. The demultiplexer 136 outputs output of one pin of the driver IC 134 to d data lines in series (d is an integer more than 1). The demultiplexer 136 changes the output data line for the data signal from the driver IC 134 d times per scanning period to drive d times as many data lines as output pins of the driver IC 134.

Configuration of Pixel Circuit

Figure 2A:
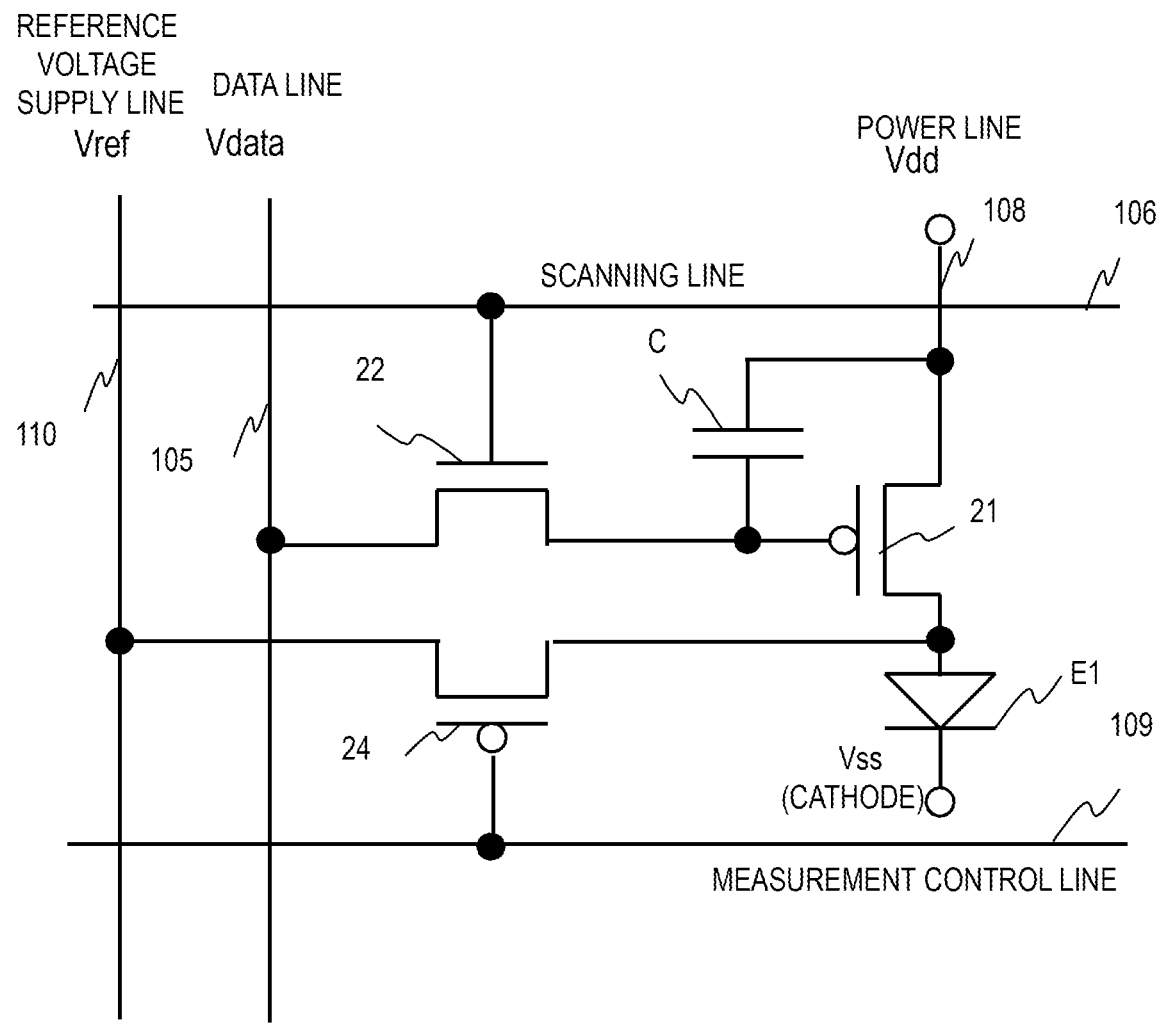
FIG. 2A illustrates a configuration example of a pixel circuit in an OLED display device.

A plurality of pixel circuits are formed on the TFT substrate 100 to control electric current to be supplied to the anode electrodes of subpixels. FIG. 2A illustrates a configuration example of a pixel circuit. Each pixel circuit includes a driving transistor 21, a selection transistor 22, a measurement transistor 24, and a storage capacitor C. The pixel circuit controls light emission of an OLED element E1. The transistors are field-effect transistors and more specifically, TFTs.

The selection transistor 22 is a switch for selecting the sub-pixel. The selection transistor 22 in the configuration example of FIG. 2A is an n-type TFT and its gate terminal is connected with a scanning line 106. A source/drain terminal is connected with a data line 105. The other source/drain terminal is connected with the gate terminal of the driving transistor 21.

The driving transistor 21 is a transistor (driving TFT) for driving the OLED element E1. The driving transistor 21 is a p-type TFT and its gate terminal is connected with a source/drain terminal of the selection transistor 22. The source terminal of the driving transistor 21 is connected with a power line (Vdd) 108. The drain terminal is connected with the anode of the OLED element E1. The storage capacitor C is provided between the gate terminal and the source terminal of the driving transistor 21.

The measurement transistor 24 is a p-type TFT and controls the electric connection between a reference voltage supply line 110 and the anode of the OLED element E1. This control is performed in accordance with a control signal supplied from a measurement control line 109 to the gate of the measurement transistor 24. The measurement transistor 24 is used to measure the characteristics of the driving transistor 21 and the OLED element E1.

Next, operation of the pixel circuit is described. The scanning driver 131 outputs a selection pulse to the scanning line 106 to turn on the selection transistor 22. The data voltage supplied from the driver IC 134 through the data line 105 is stored to the storage capacitor C. The storage capacitor C holds the stored voltage during the period of one frame. The conductance of the driving transistor 21 changes in an analog manner in accordance with the stored voltage, so that the driving transistor 21 supplies a forward bias current corresponding to a light emission level to the OLED element E1.

The measurement transistor 24 can be used to measure a characteristic of the driving transistor 21. For example, the voltage-current characteristic of the driving transistor 21 can be accurately measured by measuring the current flowing from the power line 108 (Vdd) to the reference voltage supply line 110 (Vref) under the bias conditions selected so that the driving transistor 21 will operate in the saturated region and the measurement transistor 24 will operate in the linear region. If the differences in voltage-current characteristic among the driving transistors 21 for individual subpixels are compensated for by generating data signals at an external circuit, a highly uniform display image can be attained.

In the meanwhile, the voltage-current characteristic of the OLED element E1 can be accurately measured by applying a voltage to light the OLED element E1 from the reference voltage supply line 110 when the driving transistor 21 is off and the measurement transistor 24 is operating in the linear region. In the case where the OLED element E1 is deteriorated because of long-term use, for example, if the deterioration is compensated for by generating a data signal at an external circuit, the display device can have a long life spun.

The circuit configuration in FIG. 2A is an example; the pixel circuit may have a different circuit configuration. The number of TFTs and capacitive elements included in the pixel circuit and the conductive types of the individual TFTs are determined in accordance with the design of the TFT substrate.

Figure 2B:
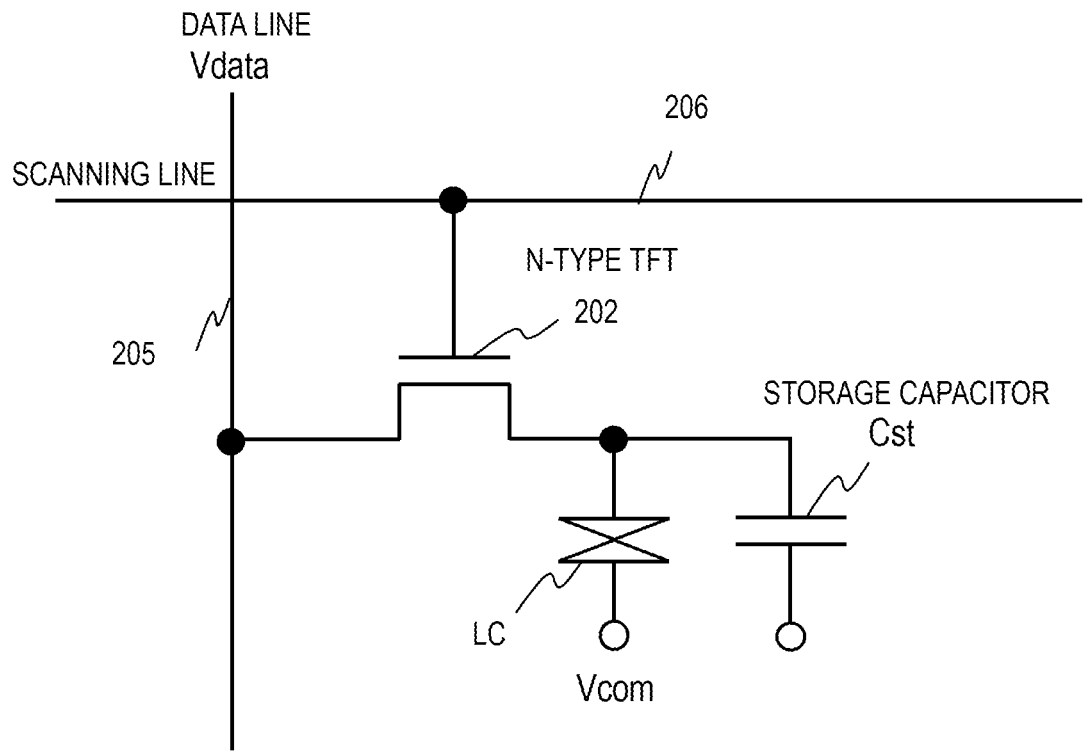
FIG. 2B illustrates a configuration example of a pixel circuit in a liquid crystal display device.
Figure 2C:
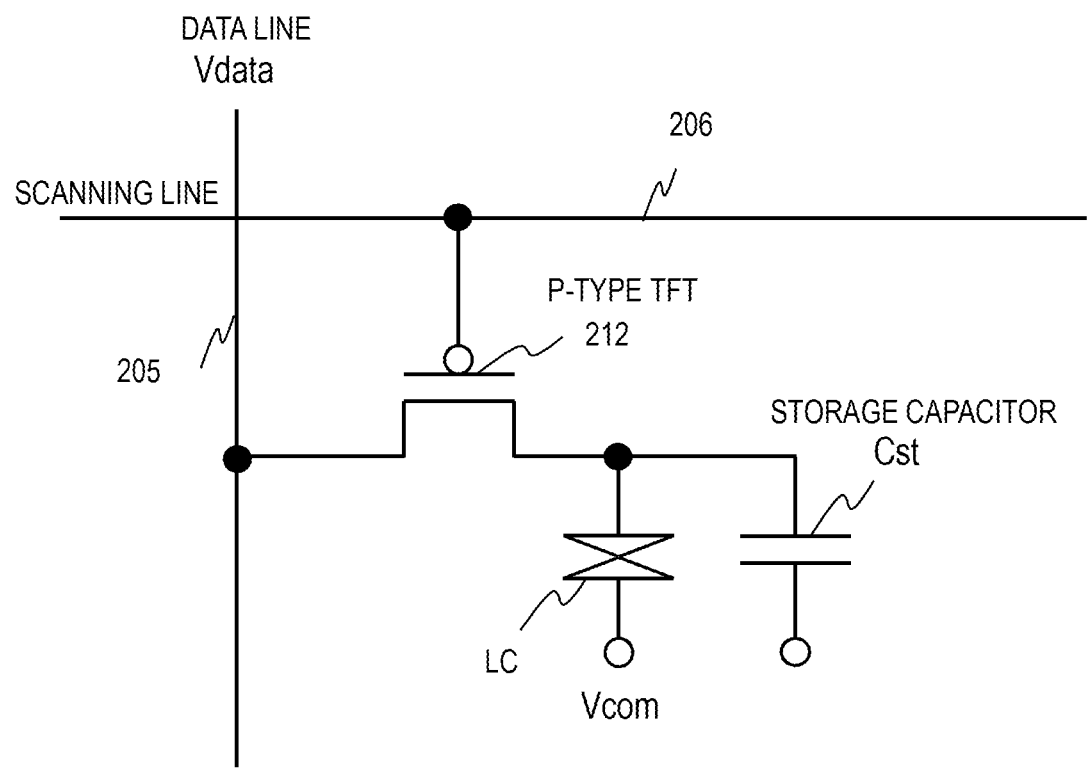
FIG. 2C illustrates another configuration example of a pixel circuit in a liquid crystal display device.

Next, examples of a pixel circuit in a liquid crystal display device are described. Each of FIGS. 2B and 2C illustrates an example of a pixel circuit in a liquid crystal display device. The example of a pixel circuit in FIG. 2B includes an n-type switch thin-film transistor 202, a storage capacitor Cst, and liquid crystal LC between a common electrode and a pixel electrode. The common electrode is supplied with a common potential Vcom. A scanning driver outputs a selection pulse to a scanning line 206 to turn on the n-type switch thin-film transistor 202. A data line 205 supplies a data signal Vdata to the pixel electrode and the storage capacitor Cst via the n-type switch thin-film transistor 202 being ON.

The example of a pixel circuit in FIG. 2C includes a p-type switch thin-film transistor 212, a storage capacitor Cst, and liquid crystal LC between a common electrode and a pixel electrode. The common electrode is supplied with a common potential Vcom. A scanning driver outputs a selection pulse to a scanning line 206 to turn on the p-type switch thin-film transistor 212. A data line 205 supplies a data signal Vdata to the pixel electrode and the storage capacitor Cst via the p-type switch thin-film transistor 212 being ON.

The scanning drivers 131 and 132 include a shift register for serially selecting scanning lines 106 and measurement control lines 109, respectively. The shift register described in the following is applicable to either one or both of the scanning drivers 131 and 132.

Configuration of CMOS Circuit

Figure 3A:
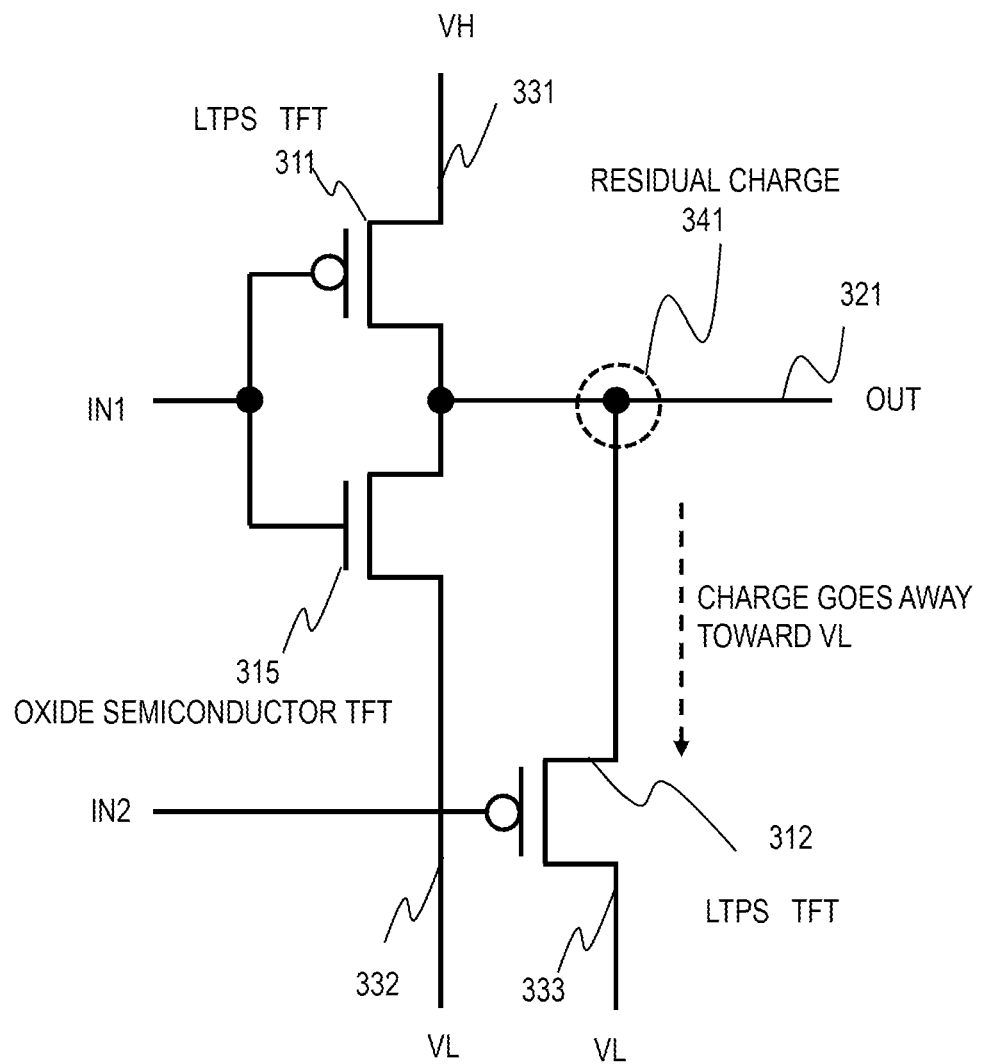
FIG. 3A illustrates a configuration of a CMOS circuit in an embodiment of this specification.

FIG. 3A illustrates a configuration of a CMOS circuit in an embodiment of this specification. The CMOS circuit can be included in either one or both of the scanning drivers 131 and 132, for example. The CMOS circuit includes a first p-type TFT 311, a second p-type TFT 312, and an n-type TFT 315. The first p-type TFT 311 is a pull-up TFT and the second p-type TFT 312 and the n-type TFT 315 are pull-down TFTs. In the configuration example of FIG. 3A, the p-type TFTs 311 and 312 are LTPS TFTs and the n-type TFT 315 is an oxide semiconductor TFT such as an IGZO TFT.

The p-type pull-up TFT 311 is located between a high-potential line 331 for supplying a high potential VH and an output line 321 for outputting an output signal OUT. The source and the drain of the p-type pull-up TFT 311 are connected with the high-potential line 331 and the output line 321. The high-potential line 331 is a part of a first output signal supply line.

The p-type pull-down TFT 312 is located between a low-potential line 333 for supplying a low potential VL lower than the high potential VH and the output line 321. The source and the drain of the p-type pull-down TFT 312 are connected with the low-potential line 333 and the output line 321. The low-potential line 333 is a part of a second output signal supply line.

The n-type pull-down TFT 315 is located between a low-potential line 332 for supplying the low potential VL and the output line 321. The source and the drain of the n-type pull-down TFT 315 are connected with the low-potential line 332 and the output line 321. The low-potential line 332 supplies the low potential VL and is a part of the second output signal supply line, like the low-potential line 333. The low-potential line 332 can be connected with the low-potential line 333. The potential at the intermediate node between a source/drain of the p-type pull-up TFT 311 and a source/drain of the pull-down TFT 312 or the potential at the intermediate node between the source/drain of the p-type pull-up TFT 311 and a source/drain of the pull-down TFT 315 is the potential of the signal OUT on the output line 321.

The gate of the p-type pull-up TFT 311 and the gate of the n-type pull-down TFT 315 are supplied with the same control signal (first gate signal) IN1. The gate of the p-type pull-down TFT 312 is supplied with another control signal (second gate signal) IN2 different from the control signal IN1. As will be described later, when the p-type pull-up TFT 311 is ON, the pull-down TFTs 312 and 315 are OFF. Conversely, when the pull-down TFTs 312 and 315 are ON, the p-type pull-up TFT 311 is OFF.

In the example of FIG. 3A, the control signals IN1 and IN2 exhibit opposite temporal variations. Although the same control signal IN1 is supplied to the gates of the p-type pull-up TFT 311 and the n-type pull-down TFT 315 in the example of FIG. 3A, different control signals transmitted through separate lines but varying identically can be supplied to the gates of the p-type pull-up TFT 311 and the n-type pull-down TFT 315.

Pulling up the output line 321 to the high potential VH is performed by the p-type pull-up TFT 311. When the p-type pull-up TFT 311 is ON, the p-type pull-up TFT 311 supplies the high potential VH of the high-potential line 331 to the output line 321.

The driving ability of the p-type pull-down TFT 312 is higher than the driving ability of the n-type pull-down TFT 315. The p-type pull-down TFT 312 pulls down the potential of the output line 321 to a potential higher than the low potential VL by a predetermined voltage. The predetermined voltage is substantially equal to the threshold voltage Vth of the p-type pull-down TFT 312. In other words, the p-type pull-down TFT 312 pulls down the potential of the output line 321 to the potential (VL+Vth). The n-type pull-down TFT 315 successively pulls down the potential of the output line 321 to the low potential VL.

Oxide semiconductor TFTs generate low off-leakage current, compared to LTPS TFTs. The configuration example in FIG. 3A includes a p-type pull-down TFT 312 between the output line 321 and the low-potential line 333. This means that a leaking path passing through the LTPS TFT 312 exists between the power line 321 and the low-potential line 333. Accordingly, the p-type pull-down TFT 312 can reduce the operational failure or the impairment of the reliability caused by the residual charge 341 in the output line 321 in turning off the display.

Since the n-type pull-down TFT 315 does not need to have high driving ability, it can be down-sized. For example, the n-type pull-down TFT 315 can have a channel width equal to or narrower than that of the p-type pull-up TFT 311. The two p-type TFTs 311 and 312 can have the same channel width and they can have the identical structures. In another example, the p-type pull-up TFT 311 can have a channel width wider than that of the p-type pull-down TFT 312.

Figure 3B:
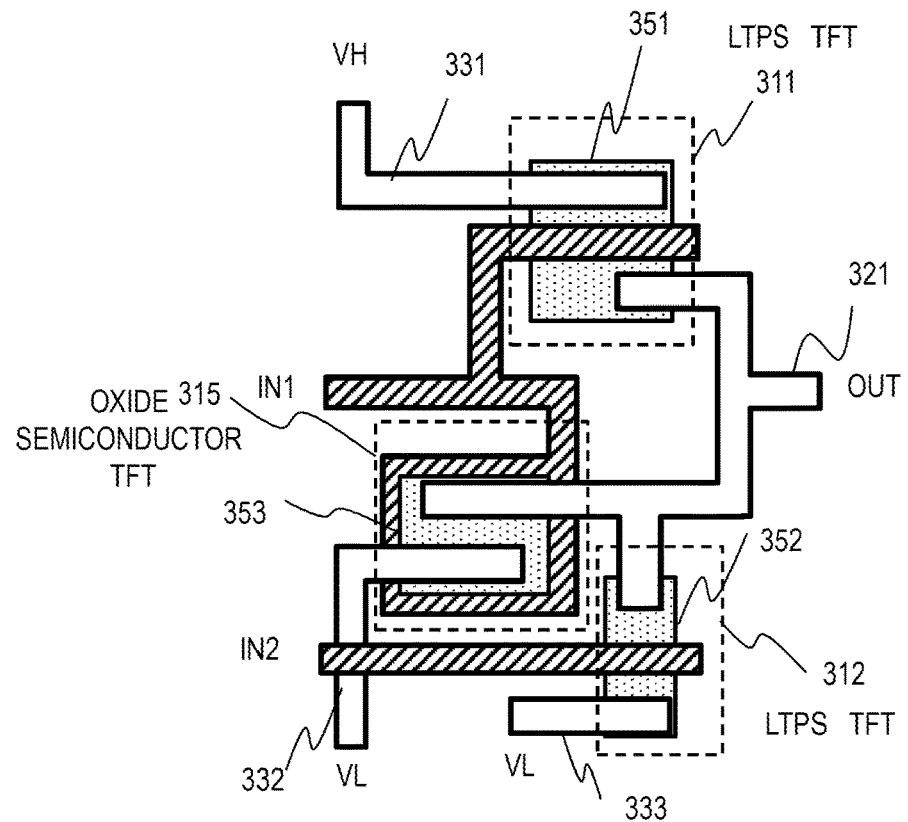
FIG. 3B schematically illustrates an example of the device layout of the CMOS circuit illustrated in FIG. 3A.
Figure 3C:
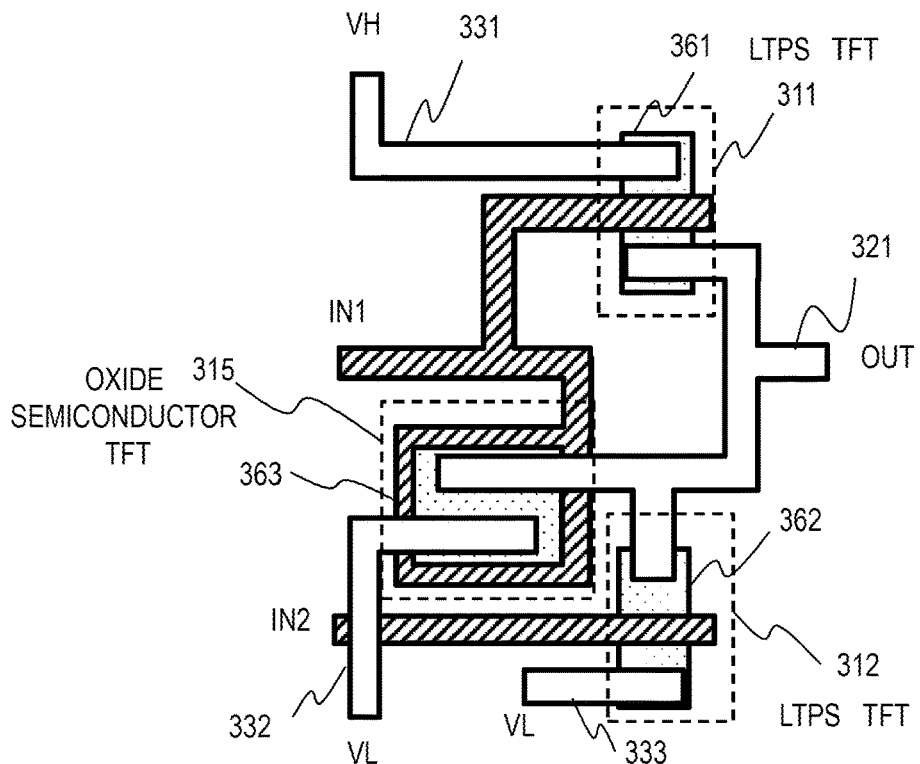
FIG. 3C schematically illustrates another example of the device layout of the CMOS circuit illustrated in FIG. 3A.

FIGS. 3B and 3C schematically illustrate examples of the device layout of the CMOS circuit illustrated in FIG. 3A. In the device layouts in FIGS. 3B and 3C, the n-type pull-down TFT 315 of an oxide semiconductor TFT is smaller in size (channel width) than the n-type pull-down TFT in the conventional configuration that does not include the p-type pull-down TFT 312.

In FIG. 3B, the p-type pull-up TFT 311 and the p-type pull-down TFT 312 have a top-gate structure and the n-type pull-down TFT 315 has a bottom-gate structure. The channels of the p-type TFTs 311 and 312 are included in the LTPS films 351 and 352, respectively. The channel of the n-type TFT 315 is included in the oxide semiconductor film 353. In the configuration example of FIG. 3B, the p-type pull-up TFT 311 has a channel width wider than that of the p-type pull-down TFT 312.

In FIG. 3C, the channels of the p-type TFTs 311 and 312 are included in the LTPS films 361 and 362, respectively. The channel of the n-type TFT 315 is included in the oxide semiconductor film 363. In the configuration example of FIG. 3C, the p-type pull-up TFT 311 can have a channel width equal to the channel width of the p-type pull-down TFT 312.

Embodiment 2

Figure 4:
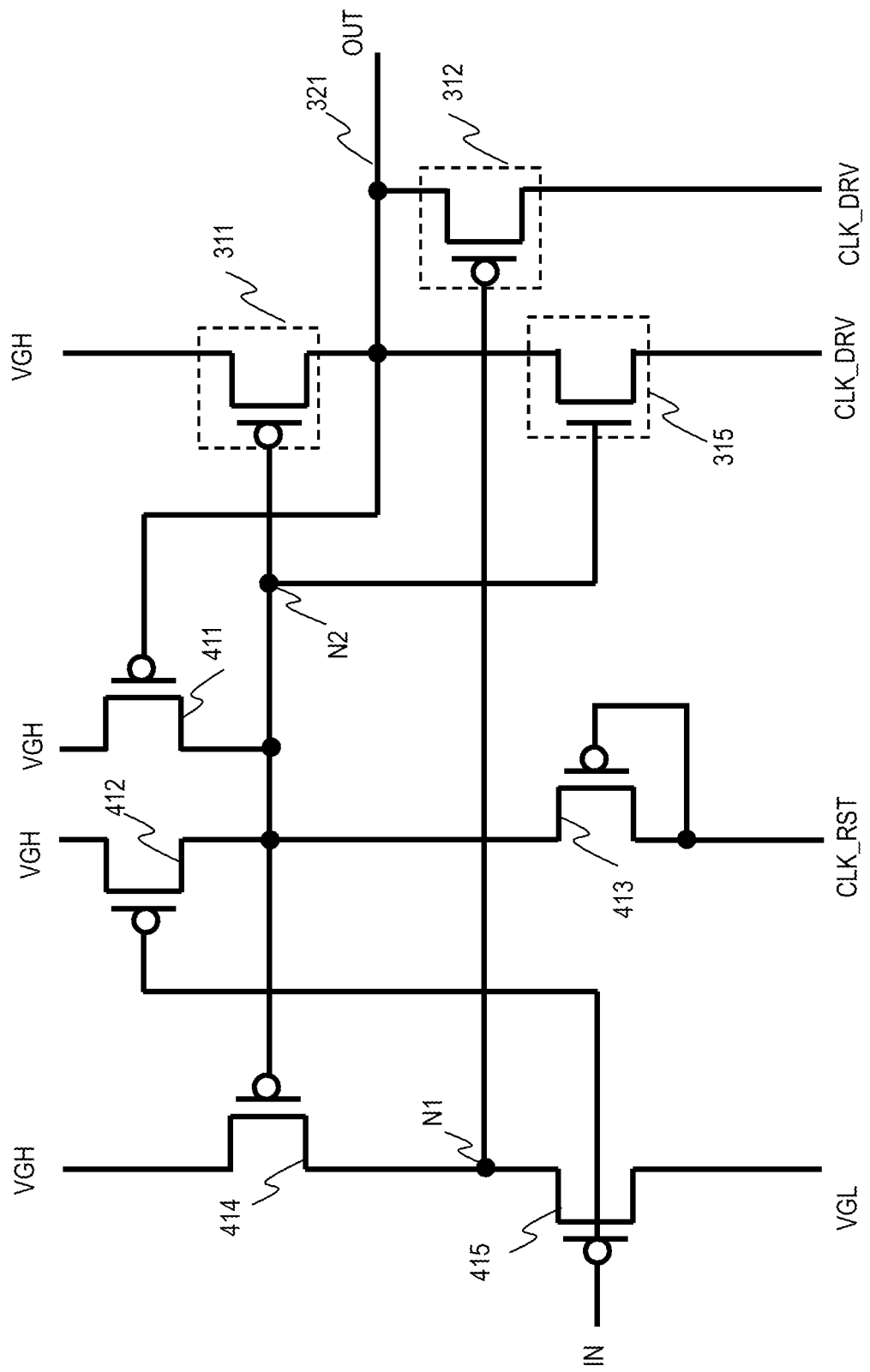
FIG. 4 schematically illustrates a circuit configuration of a shift register unit that can be included in a shift register of a scanning driver.

Hereinafter, a configuration for outputting a gate signal for a p-type TFT in a pixel circuit is described. FIG. 4 schematically illustrates a circuit configuration of one stage of shift register (also referred to as a flip-flop or a shift register unit). The shift register unit in FIG. 4 includes a CMOS circuit illustrated in FIG. 3A. The shift register unit in FIG. 4 can be included in a shift register in the scanning driver 132 of an OLED display device or the scanning driver for a liquid-crystal pixel circuit illustrated in FIG. 2C, for example.

The shift register unit outputs a gate signal for the p-type TFT 24 in FIG. 2A or the p-type TFT 212 in FIG. 2C, for example. This shift register unit supplies output signal pulses at a low potential level to the gate of the p-type TFT 24 or 212. In the circuit described in the following, the p-type TFTs can be LTPS TFTs and the n-type TFTs can be oxide semiconductor TFTs. The TFTs in the shift register unit operate by turning ON and OFF.

The inputs to the shift register unit are a high power-supply potential VGH, a low power-supply potential VGL, an input signal IN from the previous shift register unit, and clock signals CLK_DRV and CLK_RST that cyclically change with time between a high potential and a low potential. The input signal IN and the clock signals CLK_DRV and CLK_RST change between a high potential (high level) equal to the high power-supply potential VGH and a low potential (low level) equal to the low power-supply potential VGL. The output from the output line 321 is a signal to the next shift register unit.

The shift register unit includes a p-type pull-up TFT 311, a p-type pull-down TFT 312, and an n-type pull-down TFT 315 described with reference to FIG. 3A. The gate of the p-type pull-up TFT 311 and the gate of the n-type pull-down TFT 315 are connected via a node N2. These gates are supplied with the same potential. The shift register unit further includes p-type TFTs 411 to 415.

One of the p-type TFTs 412 and 415 is an example of a first control switch TFT and the other one is an example of a second control switch TFT. The p-type TFT 414 is an example of a third control switch TFT and the p-type TFT 413 is an example of a fourth control switch TFT.

A source/drain of the p-type pull-up TFT 311 is supplied with the constant high power-supply potential VGH. A source/drain of the pull-down TFT 312 and a source/drain of the pull-down TFT 315 are supplied with the clock signal CLK_DRV. As will be described later, when the pull-down TFTs 312 and 315 are ON, the clock signal CLK_DRV is at a low potential level that is lower than the high power-supply potential VGH. Its potential is equal to the low power-supply potential VGL.

The gate of the p-type TFT 411 is connected with the output line 321 and they are at the same potential. A source/drain of the p-type TFT 411 is connected with the gate of the p-type pull-up TFT 311 and they are at the same potential. The other source/drain of the p-type TFT 411 is supplied with the high power-supply potential VGH. The high power-supply potential VGH is constant. The p-type TFT 411 prevents the node N2 from floating or the circuit operation from becoming unstable. The p-type TFT 411 is optional.

The gate of the p-type TFT 412 is supplied with the signal IN. A source/drain of the p-type TFT 412 is connected with the gate of the p-type pull-up TFT 311 and they are at the same potential. The other source/drain of the p-type TFT 412 is supplied with the high power-supply potential VGH.

The source of the p-type TFT 413 is connected with the gate of the p-type pull-up TFT 311 and they are at the same potential. The gate and the drain of the p-type TFT 413 are connected and therefore, the p-type TFT 413 is diode-connected. The drain is supplied with the clock signal CLK_RST.

The gate of the p-type TFT 414 is connected with the gate of the p-type pull-up TFT 311 and they are at the same potential. A source/drain of the p-type TFT 414 is connected with the gate of the p-type pull-down TFT 312 via a node N1 and they are at the same potential. The other source/drain of the p-type TFT 414 is supplied with the high power-supply potential VGH.

The gate of the p-type TFT 415 is supplied with the signal IN. A source/drain of the p-type TFT 415 is connected with the gate of the p-type pull-down TFT 312 via the node N1 and they are at the same potential. The other source/drain of the p-type TFT 415 is supplied with the low power-supply potential VGL. The low power-supply potential VGL is constant.

Figure 5:
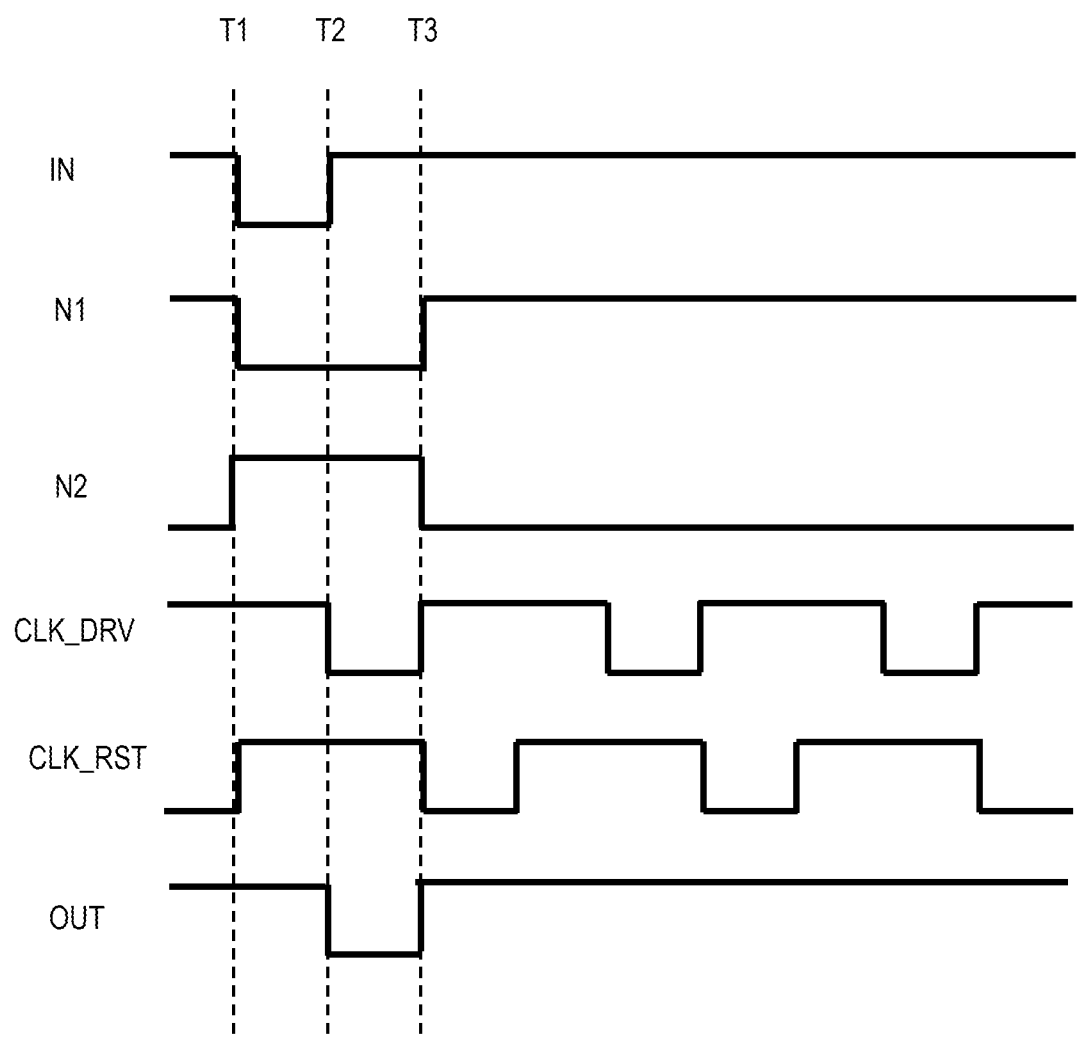
FIG. 5 is a timing chart of the circuit illustrated in FIG. 4.

Hereinafter, operation of the circuit illustrated in FIG. 4 is described. FIG. 5 is a timing chart of the circuit illustrated in FIG. 4. In the following description, the high potential level of the signals is expressed as H and the low potential level as L. As to all signals, their high potential level is the high power-supply potential VGH and their low potential level is the low power-supply potential VGL. All signals in FIG. 5 are synchronized.

First, the state immediately before a time T1 is described. The input signal IN is H; the clock signal CLK_DRV is H; and the clock signal CLK_RST is L. The potential at the node N1 is H and the potential at the node N2 is L. The p-type TFTs 415 and 412 are OFF. The diode-connected p-type TFT 413 is in a forward-biased state. The p-type pull-down TFT 312 is OFF. The n-type pull-down TFT 315 is OFF. The p-type pull-up TFT 311 and the p-type TFT 414 are ON. The p-type TFT 411 is OFF. The output signal OUT is H.

Next, operation of the elements at the time T1 is described. The input signal IN changes from H to L. A transfer pulse (the low potential level L in the input signal IN) is input from the previous shift register unit during the period from the time T1 to a time T2. The clock signal CLK_RST changes from L to H.

The p-type TFTs 415 and 412 turn ON in response to the above-described change in the input signal IN. The p-type TFT 413 turns into a reverse-biased state in response to the above-described change in the clock signal CLK_RST. The potential at the node N1 changes from H to L and the potential at the node N2 changes from L to H.

Since the potential at the node N1 changes from H to L, the p-type pull-down TFT 312 turns ON. Since the potential at the node N2 changes from L to H, the n-type pull-down TFT 315 turns ON. Since the clock signal CLK_DRV keeps H, the output signal OUT keeps H. Since the output signal OUT keeps H, the p-type TFT 411 remains OFF.

Next, operation of the elements at the time T2 is described. The input signal IN changes from L to H. The p-type TFTs 415 and 412 turn OFF. The clock signal CLK_RST keeps H. The potential at the node N1 is L and the node N1 is in a floating state.

The clock signal CLK_DRV changes from H to L. In response, the output signal OUT changes from H to L and further, the p-type TFT 411 turns ON. The potential at the node N2 remains at H. The shift register unit outputs a pulse to be transferred to the control line for the display region 125 and the next shift register unit during the period from the time T2 to a time T3.

Next, operation of the elements at the time T3 is described. The input signal IN keeps H and the p-type TFTs 415 and 412 remain OFF. The clock signal CLK_DRV changes from L to H and the clock signal CLK_RST changes from H to L. The p-type TFT 413 turns into a forward-biased state.

The node N2 is supplied with the clock signal CLK_RST and the potential at the node N2 changes from H to L. The p-type TFT 414 turns ON and the potential at the node N1 changes from L to H.

In response to the change of the potential at the node N2 from H to L, the n-type pull-down TFT 315 turns OFF and the p-type pull-up TFT 311 turns ON. In response to the change of the potential at the node N1 from L to H, the p-type pull-down TFT 312 turns OFF. The output signal OUT changes from L to H. The p-type TFT 411 turns OFF. The period from the time T2 to a time T3 is an output period to output a signal pulse.

After the time T3, the clock signals CLK_DRV and CLK_RST change periodically. Since the potential at the node N2 is L, the changes of the clock signal CLK_RST do not change the potential at the node N2. The potentials at the nodes N1 and N2 are maintained. Since the TFTs 312 and 315 are OFF, the changes of the clock signal CLK_DRV do not change the potential of the output signal OUT. Hence, the potential of the output signal OUT is kept at H. The node potentials in the shift register unit change in response to the next change of the input signal IN.

As described with reference to FIG. 5, the operation of the shift register unit illustrated in FIG. 4 does not need boot-strapping. Accordingly, a capacitor required for the boot-strapping is not necessary and therefore, a small circuit area can be attained.

Figure 6:
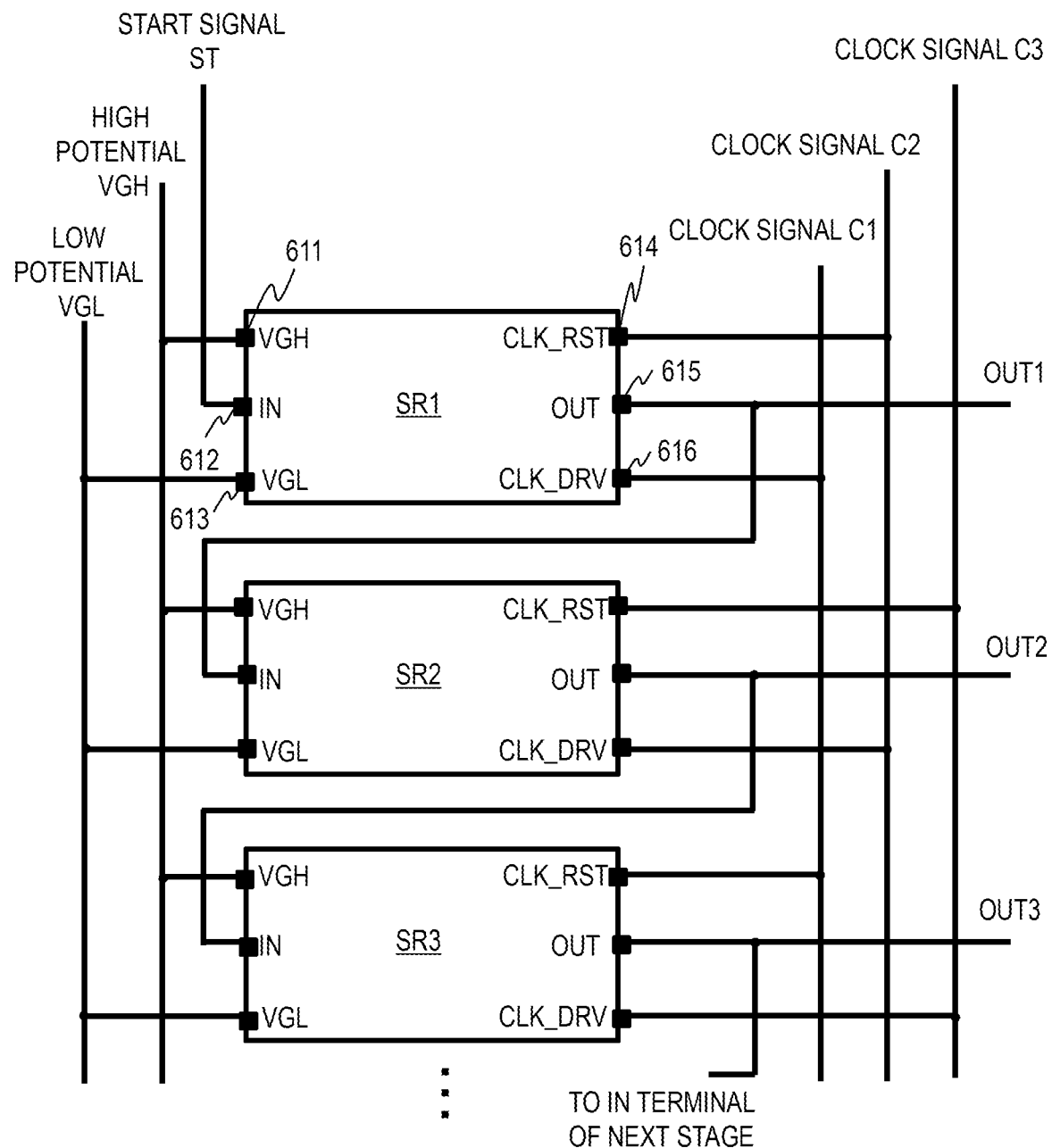
FIG. 6 illustrates a part of a shift register applicable to a scanning driver.

FIG. 6 illustrates a part of a shift register applicable to the scanning driver 132. Specifically, FIG. 6 illustrates a shift register unit SR1 of the first stage, a shift register unit SR2 of the second stage, and a shift register unit SR3 of the third stage. Each of the shift register units SR1, SR2, and SR3 can have the circuit configuration described with reference to FIGS. 4 and 5. The shift register can include n shift register units (n is a positive integer) successively connected in accordance with the design.

Each shift register unit includes a plurality of signal terminals, specifically, a VGH terminal 611, an IN terminal 612, a VGL terminal 613, a CLK_RST terminal 614, an OUT terminal 615, and a CLK_DRV terminal 616. In FIG. 6, the terminals of the first shift register unit SR1 are provided with reference signs, by way of example.

The OUT terminal 615 outputs the output signal OUT in FIG. 5. The VGH terminal 611 is supplied with the constant high power-supply potential VGH described with reference to FIG. 4. The VGL terminal 613 is supplied with the constant low power-supply potential VGL described with reference to FIG. 4. The signal to be input to the IN terminal 612 is the input signal IN in FIG. 5. The signal to be input to the CLK_RST terminal 614 is the clock signal CLK_RST in FIG. 5. The signal to be input to the CLK_DRV terminal 616 is the clock signal CLK_DRV in FIG. 5. Some of the input signals for a shift register unit are supplied from the driver IC 134.

The shift register units SR1, SR2, and SR3 output output signals OUT1, OUT2, and OUT3, respectively, from their OUT terminals 615. Each output signal is supplied to the gate of the TFT 24 in a pixel circuit and further, to the IN terminal 612 of the next shift register unit. The IN terminal 612 of the first shift register unit SR1 is supplied with a start signal ST.

The CLK_RST terminal 614 of the (3k−2)th stage (k is a positive integer) is supplied with a clock signal C2. The CLK_DRV terminal 616 of the (3k−2)th stage is supplied with a clock signal C1. The CLK_RST terminal 614 of the (3k−1)th stage is supplied with a clock signal C3. The CLK_DRV terminal 616 of the (3k−1)th stage is supplied with the clock signal C2. The CLK_RST terminal 614 of the 3k-th stage is supplied with the clock signal C1. The CLK_DRV terminal 616 of the 3k-th stage is supplied with the clock signal C3.

Figure 7:
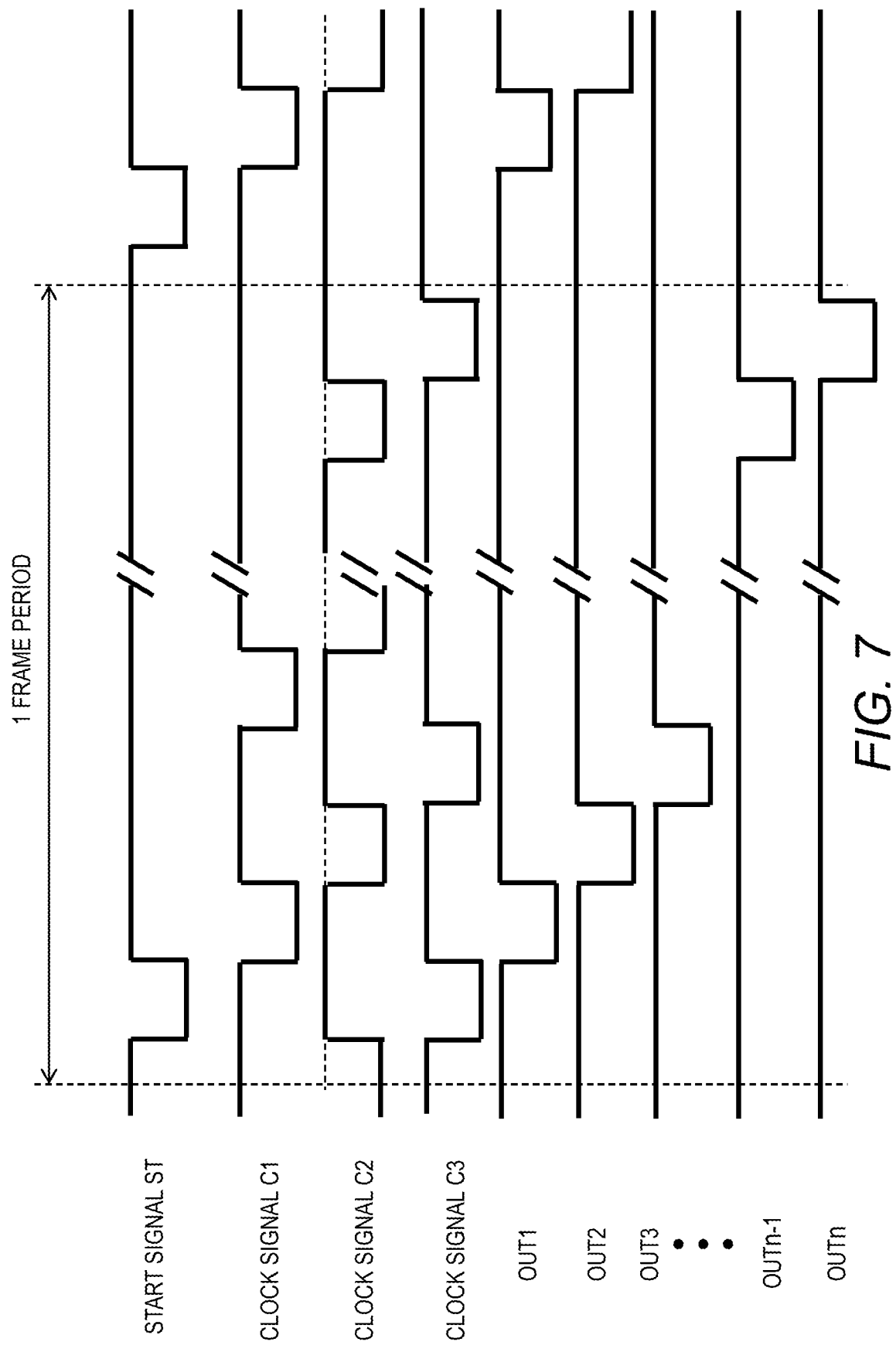
FIG. 7 is a timing chart of the signals to and from the shift register illustrated in FIG. 6.

FIG. 7 is a timing chart of the signals to and from the shift register illustrated in FIG. 6. The start signal ST supplies low potential level pulses with a cycle of one frame. Each of the clock signals C1, C2, and C3 supplies low potential pulses with a regular cycle within one frame period. The pulse widths of the clock signals C1, C2, and C3 are equal and further, they are equal to the pulse width of the start signal ST.

The clock signals C1, C2, and C3 have the same pulse cycles but have different phases. The phases of the clock signals C1, C2, and C3 are shifted by one pulse width each. That is to say, a pulse of the clock signal C2 is generated simultaneously with the end of a pulse of the clock signal C1; a pulse of the clock signal C3 is generated simultaneously with the end of the pulse of the clock signal C2; and another pulse of the clock signal C1 is generated simultaneously with the end of the pulse of the clock signal C3. The start time and the end time of each pulse of the start signal ST coincide with the start time and the end time of one pulse of the clock signal C3.

FIG. 7 illustrates temporal variations of the output signals OUT1 to OUTn of the first to the n-th shift register units. The output signals OUT1 to OUTn generate a low-potential pulse one after another. The pulse widths of the output signals OUT1 to OUTn are the same as the pulse widths of the other signals. An output signal pulse of each shift register unit is generated simultaneously with the end of an output signal pulse of the shift register unit of the previous stage.

Embodiment 3

Figure 8:
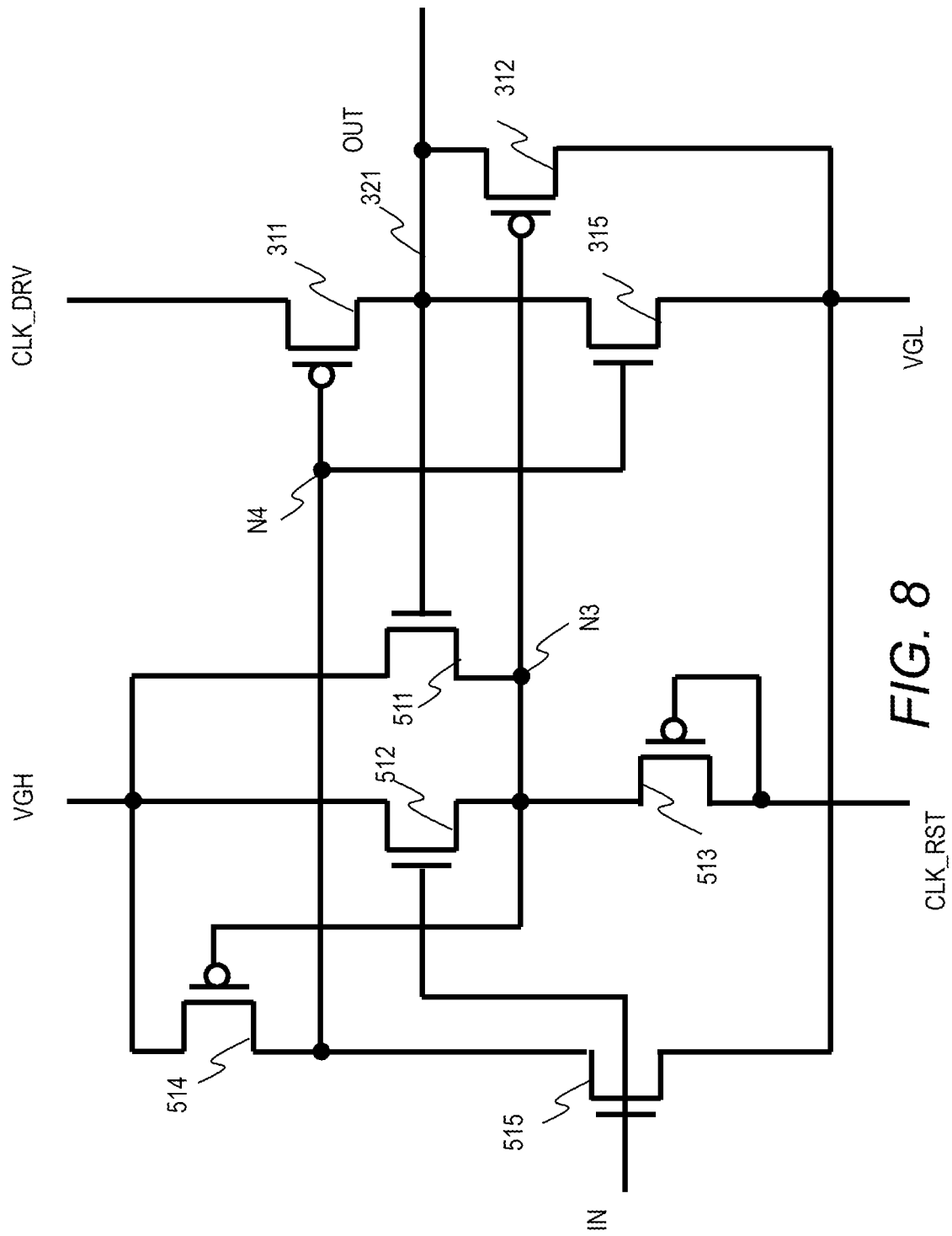
FIG. 8 illustrates a circuit configuration of a shift register unit that can be included in another scanning driver.

Hereinafter, a configuration for outputting a gate signal for a n-type TFT in a pixel circuit is described. FIG. 8 schematically illustrates a circuit configuration of one stage of shift register (also referred to as a flip-flop or a shift register unit). The shift register unit in FIG. 8 includes a CMOS circuit illustrated in FIG. 3A. The shift register unit in FIG. 8 can be included in a shift register in the scanning driver 131 of an OLED display device or the scanning driver for a liquid-crystal pixel circuit illustrated in FIG. 2B, for example.

As described with reference to FIG. 2A, the scanning driver 131 outputs a gate signal for the n-type TFT 22 in a pixel circuit. The pixel circuit in FIG. 2B includes an n-type TFT 202 as a switch transistor to be controlled. This shift register unit supplies output signal pulses at a high potential level to the gate of the n-type TFT 22 or 202.

In the circuit described in the following, the p-type TFTs can be LTPS TFTs and the n-type TFTs can be oxide semiconductor TFTs. The TFTs in the shift register unit operate by turning ON and OFF.

The inputs to the shift register unit are a high power-supply potential VGH, a low power-supply potential VGL, an input signal IN from the previous shift register unit, and clock signals CLK_DRV and CLK_RST. The input signal IN and the clock signals CLK_DRV and CLK_RST change between a high potential (high level) equal to the high power-supply potential VGH and a low potential (low level) equal to the low power-supply potential VGL. The output from the output line 321 is a signal to the next shift register unit.

The shift register unit includes a p-type pull-up TFT 311, a p-type pull-down TFT 312, and an n-type pull-down TFT 315 described with reference to FIG. 3A. The gate of the p-type pull-up TFT 311 and the gate of the n-type pull-down TFT 315 are connected via a node N4. These gates are supplied with the same potential. The shift register unit further includes p-type TFTs 513 and 514 and n-type TFTs 511, 512, and 515.

One of the n-type TFTs 512 and 515 is an example of a first control switch TFT and the other one is an example of a second control switch TFT. The p-type TFT 514 is an example of a third control switch TFT and the p-type TFT 513 is an example of a fourth control switch TFT.

A source/drain of the p-type pull-up TFT 311 is supplied with the clock signal CLK_DRV. A source/drain of the pull-down TFT 312 and a source/drain of the pull-down TFT 315 are supplied with the constant low power-supply potential VGL. As will be described later, when the p-type pull-up TFT 311 is ON, the clock signal CLK_DRV is at a high potential level. Its potential is equal to the high power-supply potential VGH.

The gate of the n-type TFT 511 is connected with the output line 321 and they are at the same potential. A source/drain of the n-type TFT 511 is connected with the gate of the p-type pull-down TFT 312 via a node N3 and they are at the same potential. The other source/drain of the n-type TFT 511 is supplied with the high power-supply potential VGH. The high power-supply potential VGH is constant. The n-type TFT 511 prevents the node N3 from floating or the circuit operation from becoming unstable. The n-type TFT 511 is optional.

The gate of the n-type TFT 512 is supplied with the signal IN. A source/drain of the n-type TFT 512 is connected with the gate of the p-type pull-down TFT 312 and they are at the same potential. The other source/drain of the n-type TFT 512 is supplied with the high power-supply potential VGH.

The source of the p-type TFT 513 is connected with the gate of the p-type pull-down TFT 312 and they are at the same potential. The gate and the drain of the p-type TFT 513 are connected and therefore, the p-type TFT 513 is diode-connected. The drain is supplied with the clock signal CLK_RST.

The gate of the p-type TFT 514 is connected with the gate of the p-type pull-down TFT 312 and they are at the same potential. A source/drain of the p-type TFT 514 is connected with the gate of the p-type pull-up TFT 311 and the gate of the n-type pull-down TFT 315 via the node N4 and they are at the same potential. The other source/drain of the p-type TFT 514 is supplied with the high power-supply potential VGH.

The gate of the n-type TFT 515 is supplied with the signal IN. A source/drain of the n-type TFT 515 is connected with the gate of the p-type pull-up TFT 311 and the gate of the n-type pull-down TFT 315 via the node N4 and they are at the same potential. The other source/drain of the n-type TFT 515 is supplied with the low power-supply potential VGL. The low power-supply potential VGL is constant.

In the circuit of FIG. 8, the potential at the node N3 is equal to the gate potential of the p-type pull-down TFT 312 and the potential at the node N4 is equal to the gate potentials of the p-type pull-up TFT 311 and the n-type pull-down TFT 315.

Figure 9:
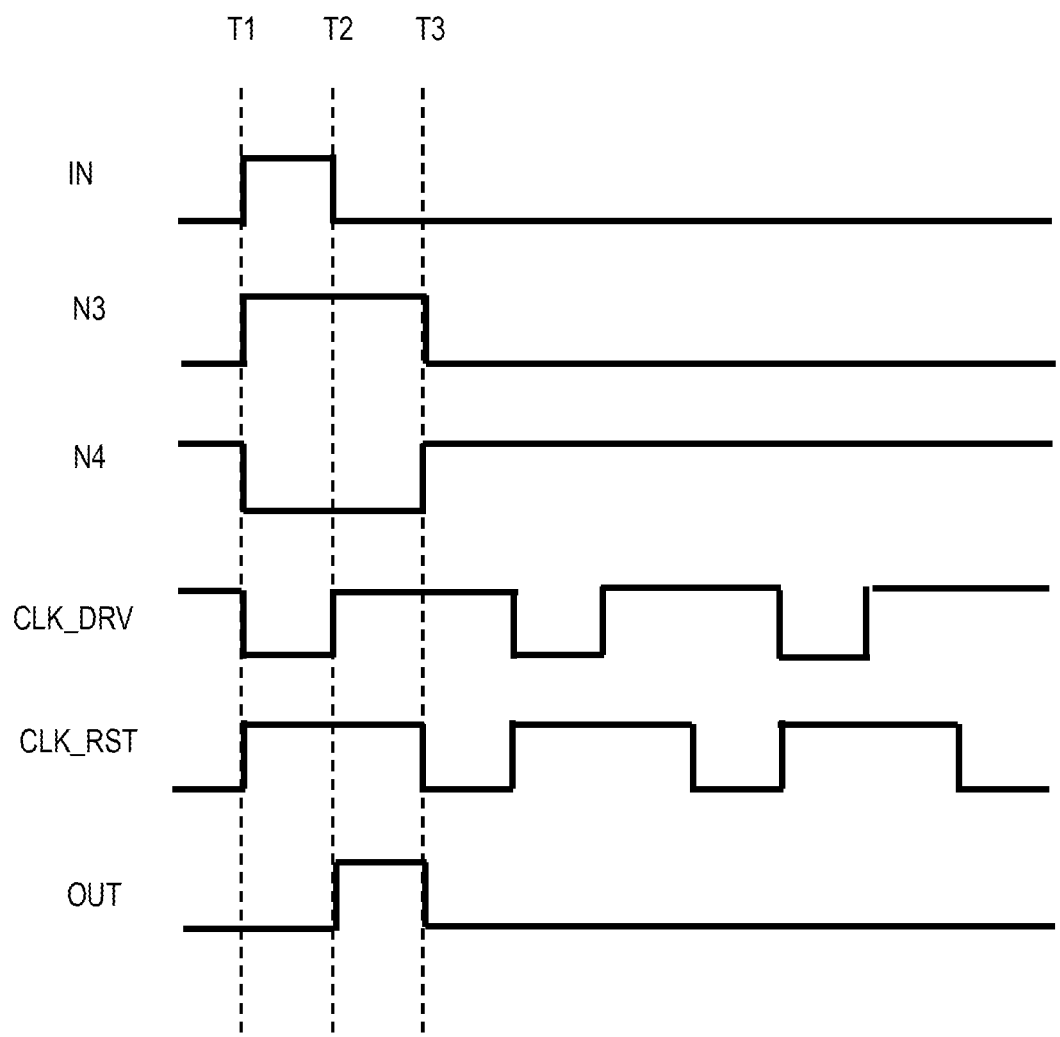
FIG. 9 is a timing chart of the circuit illustrated in FIG. 8.

Hereinafter, operation of the circuit illustrated in FIG. 8 is described. FIG. 9 is a timing chart of the circuit illustrated in FIG. 8. In the following description, the high potential level of the signals is expressed as H and the low potential level as L. As to all signals, their high potential level is the high power-supply potential VGH and their low potential level is the low power-supply potential VGL. All signals in FIG. 9 are synchronized.

First, the state immediately before a time T1 is described. The input signal IN is L; the clock signal CLK_DRV is H; and the clock signal CLK_RST is L. The potential at the node N3 is L and the potential at the node N4 is H. The n-type TFTs 515 and 512 are OFF. The diode-connected p-type TFT 513 is in a forward-biased state. The p-type pull-down TFT 312 is ON. The n-type pull-down TFT 315 is ON. The p-type pull-up TFT 311 and the p-type TFT 514 are OFF. The n-type TFT 511 is OFF. The output signal OUT is L.

Next, operation of the elements at the time T1 is described. The input signal IN changes from L to H. A transfer pulse (the high potential level H in the input signal IN) is input from the previous shift register unit during the period from the time T1 to a time T2. The clock signal CLK_DRV changes from H to L and the clock signal CLK_RST changes from L to H.

The n-type TFTs 515 and 512 turn ON in response to the above-described change in the input signal IN. The p-type TFT 513 turns into a reverse-biased state in response to the above-described change in the clock signal CLK_RST. The potential at the node N3 changes from L to H and the potential at the node N4 changes from H to L. Since the potential at the node N3 changes from L to H, the p-type pull-down TFT 312 and the p-type TFT 514 turn OFF.

Since the potential at the node N4 changes from H to L, the n-type pull-down TFT 315 turns OFF and the p-type pull-up TFT 311 turns ON. Since the clock signal CLK_DRV is L, the output signal OUT keeps L. The output signal OUT keeps L and the n-type TFT 511 remains OFF.

Next, operation of the elements at the time T2 is described. The input signal IN changes from H to L. The clock signal CLK_RST keeps H. The clock signal CLK_DRV changes from L to H.

The n-type TFTs 515 and 512 turn OFF in response to the change of the input signal IN. The potential at the node N3 is kept at H and the potential at the node N4 is kept at L. The pull-down TFTs 312 and 315 remain OFF and the p-type pull-up TFT 311 remains ON.

The clock signal CLK_DRV changes from L to H. In response, the output signal OUT changes from L to H and further, the n-type TFT 511 turns ON. The potential at the node N3 remains at H. The shift register unit outputs a pulse to be transferred to the control line for the display region 125 and the next shift register unit during the period from the time T2 to a time T3.

Next, operation of the elements at the time T3 is described. The input signal IN keeps L and the clock signal CLK_DRV keeps H. The clock signal CLK_RST changes from H to L. Since the input signal IN keeps L, the n-type TFTs 515 and 512 remain OFF.

The p-type TFT 513 turns into a forward-biased state in response to the change of the clock signal CLK_RST. Accordingly, the node N3 is supplied with the clock signal CLK_RST and its potential changes from H to L. The p-type TFT 514 turns ON and the potential at the node N4 changes from L to H.

In response to the change of the potential at the node N4 from L to H, the n-type pull-down TFT 315 turns ON and the p-type pull-up TFT 311 turns OFF. In response to the change of the potential at the node N3 from H to L, the p-type pull-down TFT 312 turns ON. The output signal OUT changes from H to L. The period from the time T2 to the time T3 is an output period to output a signal pulse.

After the time T3, the clock signals CLK_DRV and CLK_RST change periodically. Since the potential at the node N3 is L, the changes of the clock signal CLK_RST do not change the potential at the node N3. Since the n-type TFT 515 is OFF and the p-type TFT 514 is ON, the potential at the node N4 is kept at H. The potentials at the nodes N3 and N4 are maintained.

Since the p-type pull-up TFT 311 is OFF, the changes of the clock signal CLK_DRV do not change the potential of the output signal OUT. Hence, the potential of the output signal OUT is kept at L. The node potentials in the shift register unit change in response to the next change of the input signal IN.

As described with reference to FIG. 9, the operation of the shift register unit illustrated in FIG. 8 does not need boot-strapping. Accordingly, a small circuit area can be attained.

The shift register of the scanning driver 131 can have the same configuration as the configuration illustrated in FIG. 6. Each shift register unit has the circuit configuration illustrated in FIG. 8 and operates in accordance with the signals described with reference to FIG. 9.

Figure 10:
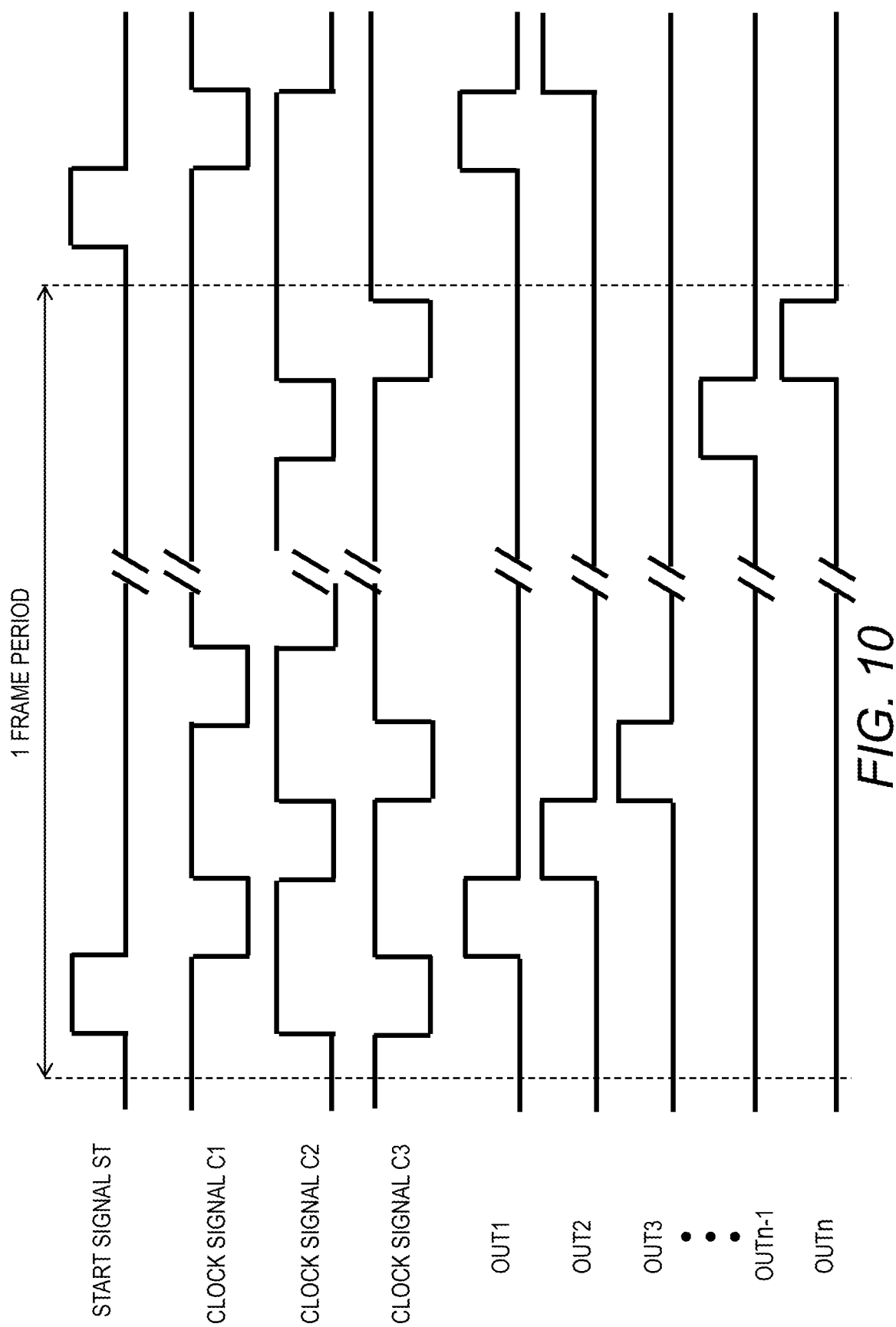
FIG. 10 is a timing chart of the signals to and from the shift register in a scanning driver.

FIG. 10 is a timing chart of the signals to and from the shift register of the scanning driver 131. The start signal ST supplies high potential level pulses with a cycle of one frame. Each of the clock signals C1, C2, and C3 supplies low potential pulses with a regular cycle within one frame period. The pulse widths of the clock signals C1, C2, and C3 are equal and further, they are equal to the pulse width of the start signal ST.

The clock signals C1, C2, and C3 have the same cycle but have different phases. The phases of the clock signals C1, C2, and C3 are shifted by one pulse width each. That is to say, a pulse of the clock signal C2 is generated simultaneously with the end of a pulse of the clock signal C1; a pulse of the clock signal C3 is generated simultaneously with the end of the pulse of the clock signal C2; and another pulse of the clock signal C1 is generated simultaneously with the end of the pulse of the clock signal C3. The start time and the end time of each pulse of the start signal ST coincide with the start time and the end time of one pulse of the clock signal C3.

FIG. 10 illustrates temporal variations of the output signals OUT1 to OUTn of the first to the n-th shift register units. The output signals OUT1 to OUTn generate a high-potential pulse one after another. The pulse widths of the output signals OUT1 to OUTn are the same as the pulse widths of the other signals. An output signal pulse of each shift register unit is generated simultaneously with the end of an output signal pulse of the shift register unit of the previous stage.

Embodiment 4

Figure 11:
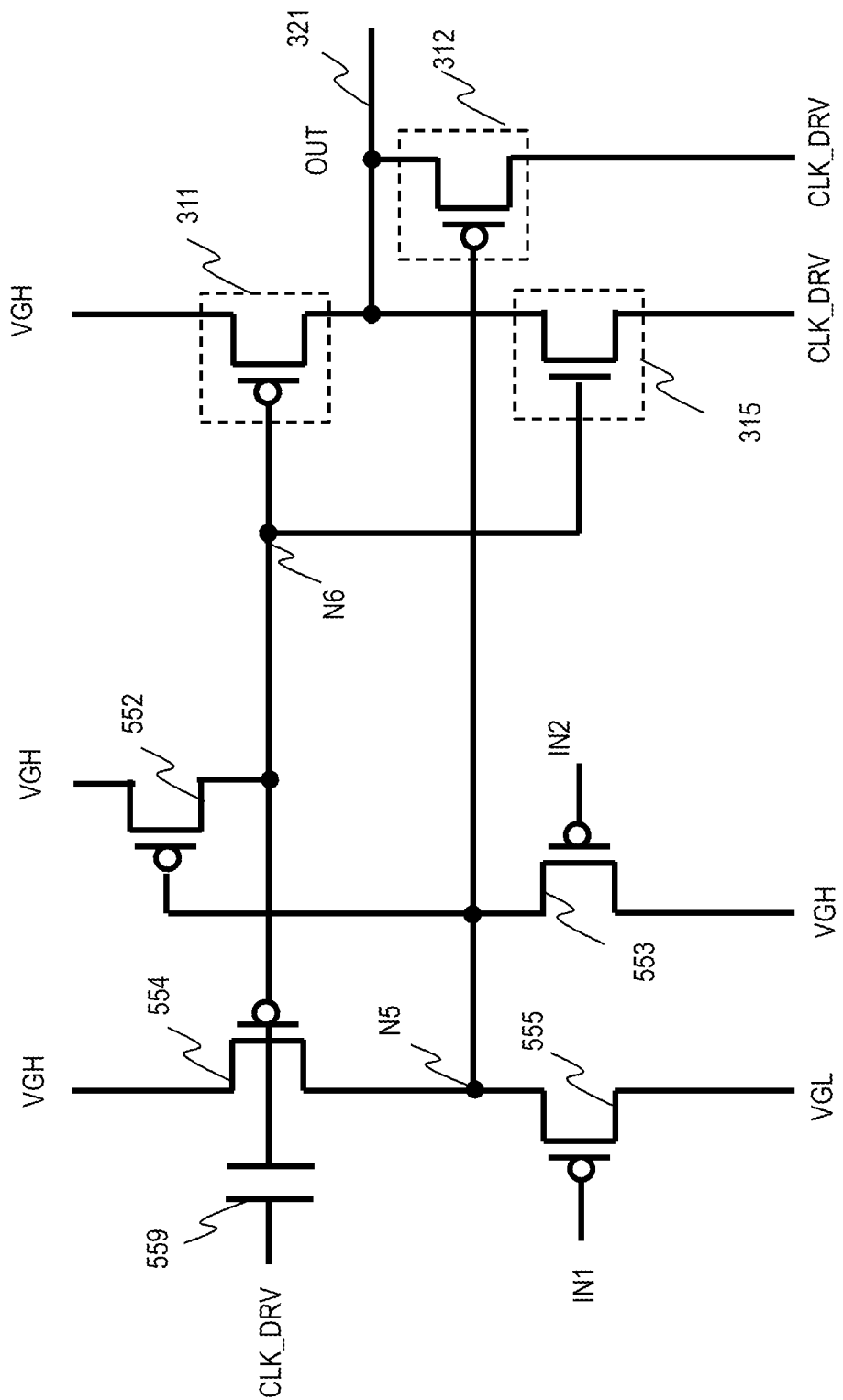
FIG. 11 illustrates another configuration example of a shift register unit.

FIG. 11 illustrates another configuration example of a shift register unit. The shift register unit in FIG. 11 can be included in a shift register in the scanning driver 132 of an OLED display device or the scanning driver for a liquid-crystal pixel circuit illustrated in FIG. 2C, for example.

The shift register unit outputs a gate signal for the p-type TFT 24 in FIG. 2A or the p-type TFT 212 in FIG. 2C, for example. This shift register unit supplies output signal pulses at a low potential level to the gate of the p-type TFT 24 or 212. In the circuit described in the following, the p-type TFTs can be LTPS TFTs and the n-type TFTs can be oxide semiconductor TFTs. The TFTs in the shift register unit operate by turning ON and OFF.

The inputs to the shift register unit are a high power-supply potential VGH, a low power-supply potential VGL, an input signal IN1 from the previous shift register unit, an input signal IN2 from the next shift register unit, and clock signals CLK_DRV and CLK_RST that cyclically change with time between a high potential and a low potential. The input signals IN1 and IN2 and the clock signals CLK_DRV and CLK_RST change between a high potential (high level) equal to the high power-supply potential VGH and a low potential (low level) equal to the low power-supply potential VGL. The output from the output line 321 is a signal to the previous and the next shift register units.

The shift register unit includes a p-type pull-up TFT 311, a p-type pull-down TFT 312, and an n-type pull-down TFT 315 described with reference to FIG. 3A. The gate of the p-type pull-up TFT 311 and the gate of the n-type pull-down TFT 315 are connected via a node N6. These gates are supplied with the same potential. The shift register unit further includes p-type TFTs 552 to 555 and a capacitor 559. The p-type TFT 554 is an example of a third control switch TFT.

A source/drain of the p-type pull-up TFT 311 is supplied with the constant high power-supply potential VGH. A source/drain of the pull-down TFT 312 and a source/drain of the pull-down TFT 315 are supplied with the clock signal CLK_DRV. When the pull-down TFTs 312 and 315 are ON, the clock signal CLK_DRV is at a low potential level that is lower than the high power-supply potential VGH. Its potential is equal to the low power-supply potential VGL.

The gate of the p-type TFT 552 is connected with the gate of the p-type pull-down TFT 312 and they are at the same potential. A source/drain of the p-type TFT 552 is connected with the gate of the p-type pull-up TFT 311 and the gate of the n-type pull-down TFT 315 and they are at the same potential. The other source/drain of the p-type TFT 552 is supplied with the high power-supply potential VGH. The high power-supply potential VGH is constant.

A source/drain of the p-type TFT 553 is connected with the gate of the p-type pull-down TFT 312 and they are at the same potential. The gate of the p-type TFT 553 is supplied with the signal IN2. The signal IN2 is the output signal of the next shift register unit.

The gate of the p-type TFT 554 is connected with the gate of the p-type pull-up TFT 311 and they are at the same potential. A source/drain of the p-type TFT 554 is connected with the gate of the p-type pull-down TFT 312 via a node N5 and they are at the same potential. The other source/drain of the p-type TFT 554 is supplied with the high power-supply potential VGH. The gates of the p-type TFT 554, the p-type TFT 311, and the n-type TFT 315 are connected with a node N6; they are supplied with the clock signal CLK_DRV through the capacitor 559.

The gate of the p-type TFT 555 is supplied with the signal IN1. A source/drain of the p-type TFT 555 is connected with the gate of the p-type pull-down TFT 312 via the node N5 and they are at the same potential. The other source/drain of the p-type TFT 555 is supplied with the low power-supply potential VGL. The low power-supply potential VGL is constant.

Figure 12:
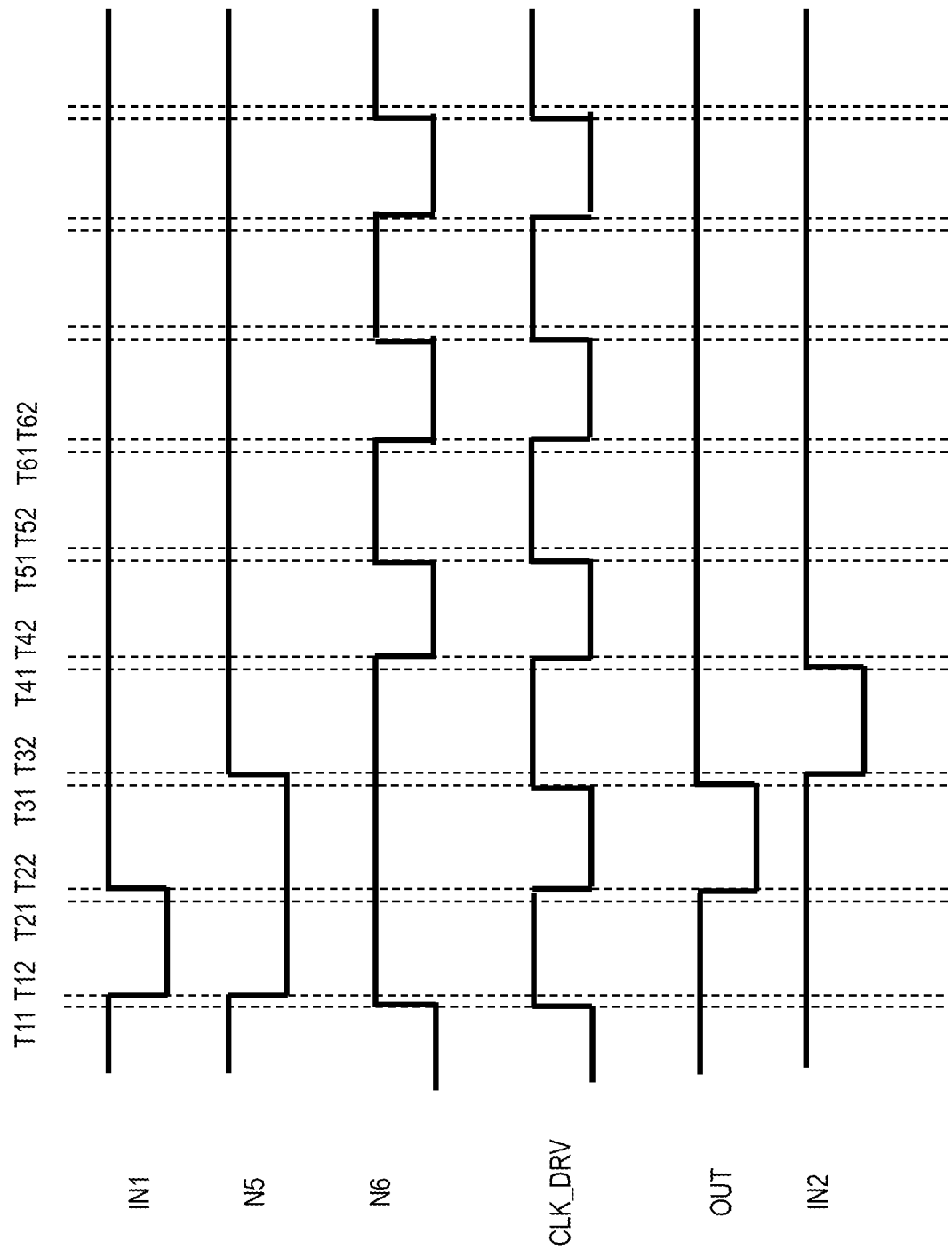
FIG. 12 is a timing chart of the circuit illustrated in FIG. 11.

Hereinafter, operation of the circuit illustrated in FIG. 11 is described. FIG. 12 is a timing chart of the circuit illustrated in FIG. 11. In the following description, the high potential level of the signals is expressed as H and the low potential level as L. As to all signals, their high potential level is the high power-supply potential VGH and their low potential level is the low power-supply potential VGL. All signals in FIG. 12 are synchronized.

First, the state immediately before a time T11 is described. The input signal IN1 is H; the clock signal CLK_DRV is L; and the input signal IN2 is H. The potential at the node N5 is H and the potential at the node N6 is L. The p-type pull-down TFT 312 is OFF. The p-type TFTs 553 and 555 are OFF. The n-type pull-down TFT 315 is OFF. The p-type pull-up TFT 311 and the p-type TFT 554 are ON. The output signal OUT is H.

Next, operation of the elements at the time T11 and a time T12 immediately after the time T11 is described. The clock signal CLK_DRV changes from L to H at the time T11 and the input signal IN1 changes from H to L at the time T12 immediately after the time T11. The potential at the node N6 changes from L to H in response to the change of the clock signal CLK_DRV. The p-type TFT 554 and the p-type pull-up TFT 311 turn OFF. The n-type pull-down TFT 315 turns ON.

In response to the change of the input signal IN1, the p-type TFT 555 turns ON and the potential at the node N5 changes from H to L. The p-type TFT 552 turns ON and the potential at the node N6 is kept at H. The p-type pull-down TFT 312 turns ON. Since the clock signal CLK_DRV is H, the output signal OUT keeps H.

Next, operation of the elements at a time T21 later than the time T12 and a time T22 immediately after the time T21 is described. No signal changes at the time T21. At the time T22, the input signal IN1 changes from L to H and the clock signal CLK_DRV changes from H to L.

The p-type TFT 555 turns OFF in response to the change of the input signal IN1. The p-type TFT 553 remains OFF. The node N5 is in a floating state and its potential is kept at L. Accordingly, the p-type pull-down TFT 312 remains ON.

Although the clock signal CLK_DRV changes to L as described above, the potential at the node N6 is kept at H with the capacitor 559 and the p-type TFT 552 being ON. Accordingly, the p-type TFT 554 and the p-type pull-up TFT 311 remain OFF and the n-type pull-down TFT 315 remains ON. Since the clock signal CLK_DRV changes from H to L, the output signal OUT changes from H to L.

Next, operation of the elements at a time T31 later than the time T22 and a time T32 immediately after the time T31 is described. The clock signal CLK_DRV changes from L to H at the time T31. The output signal OUT changes from L to H in response to the change of the clock signal CLK_DRV from L to H.

At the time T32, the input signal IN2 changes from H to L. In response to the change of the input signal IN2 from H to L, the p-type TFT 553 turns ON and the potential at the node N5 changes from L to H. In response to the potential change at the node N5, the p-type TFT 552 turns OFF and the p-type pull-down TFT 312 turns OFF.

The node N6 is in a floating state and its potential remains at H. Accordingly, the p-type pull-up TFT 311 remains OFF and the n-type pull-down TFT 315 remains ON. Since the clock signal CLK_DRV is H, the output signal OUT is H.

Next, operation of the elements at a time T41 later than the time T32 and a time T42 immediately after the time T41 is described. The input signal IN2 changes from L to H at the time T41. In response to the change of the input signal IN2 from L to H, the p-type TFT 553 turns OFF.

The clock signal CLK_DRV changes from H to L at the time T42. In response to the change of the clock signal CLK_DRV from H to L, the potential at the node N6 changes from H to L. In response, the p-type TFT 554 and the p-type pull-up TFT 311 turn ON and the n-type pull-down TFT 315 turns OFF. Since the p-type pull-up TFT 311 is ON and the pull-down TFTs 312 and 315 are OFF, the output signal OUT keeps H.

Next, operation of the elements at a time T51 later than the time T42 and a time T52 immediately after the time T51 is described. The clock signal CLK_DRV changes from L to H at the time T51. There are no changes of the signals at the time T52.

In response to the change of the clock signal CLK_DRV from L to H, the potential at the node N6 changes from L to H. In response to the change of the potential at the node N6 from L to H, the p-type TFT 554 and the p-type pull-up TFT 311 turn OFF and the n-type pull-down TFT 315 turns ON. The p-type pull-down TFT 312 remains OFF. Since the clock signal CLK_DRV is H, the output signal OUT remains at H.

Next, operation of the elements at a time T61 later than the time T52 and a time T62 immediately after the time T61 is described. There are no changes of the signals at the time T61. At the time T62, the clock signal CLK_DRV changes from H to L. In response, the potential at the node N6 changes from H to L.

In response to the change of the potential at the node N6 from H to L, the p-type TFT 554 and the p-type pull-up TFT 311 turn ON and the n-type pull-down TFT 315 turns OFF. The p-type pull-down TFT 312 remains OFF. Since the p-type pull-up TFT 311 supplies the potential VGH to the output line 321, the output signal OUT remains at H.

Subsequent to the time T62, the operation from the time T42 to the time T62 is repeated until the next frame begins. As described above, the p-type TFT 554 and the p-type pull-up TFT 311 turn ON and OFF during the period from the time T42 to the time T62. These two p-type TFTs are ON from the time T42 to the time T51 and OFF from the time T51 to the time T62 (T42).

When a p-type TFT keeps being ON, a positive Vg stress is applied to cause a Vt (threshold) shift. The above-described configuration of turning ON and OFF two p-type TFTs 554 and 311 synchronously with the clock signal CLK_DRV lightens the positive Vg stress and diminishes the instability of the circuit operation caused by Vt shift.

The periods from the time T11 to the time T12, from the time T21 to the time T22, from the time T31 to the time T32, from the time T41 to the time T42, from the time T51 to the time T52, and from the time T61 to the time T62 are very short, compared to a clock cycle. The clock cycle can be the period (length) from the time T11 to the time T31.

In one cycle of the clock signal CLK_DRV illustrated in FIG. 12, a period of being H is slightly longer than a period of being L but the difference is very small. Accordingly, the duty ratio of the clock signal CLK_DRV is substantially 50%. The clock signal CLK_DRV appropriately generates the output signal OUT and further, effectively hampers the Vt shift of the TFTs.

Figure 13:
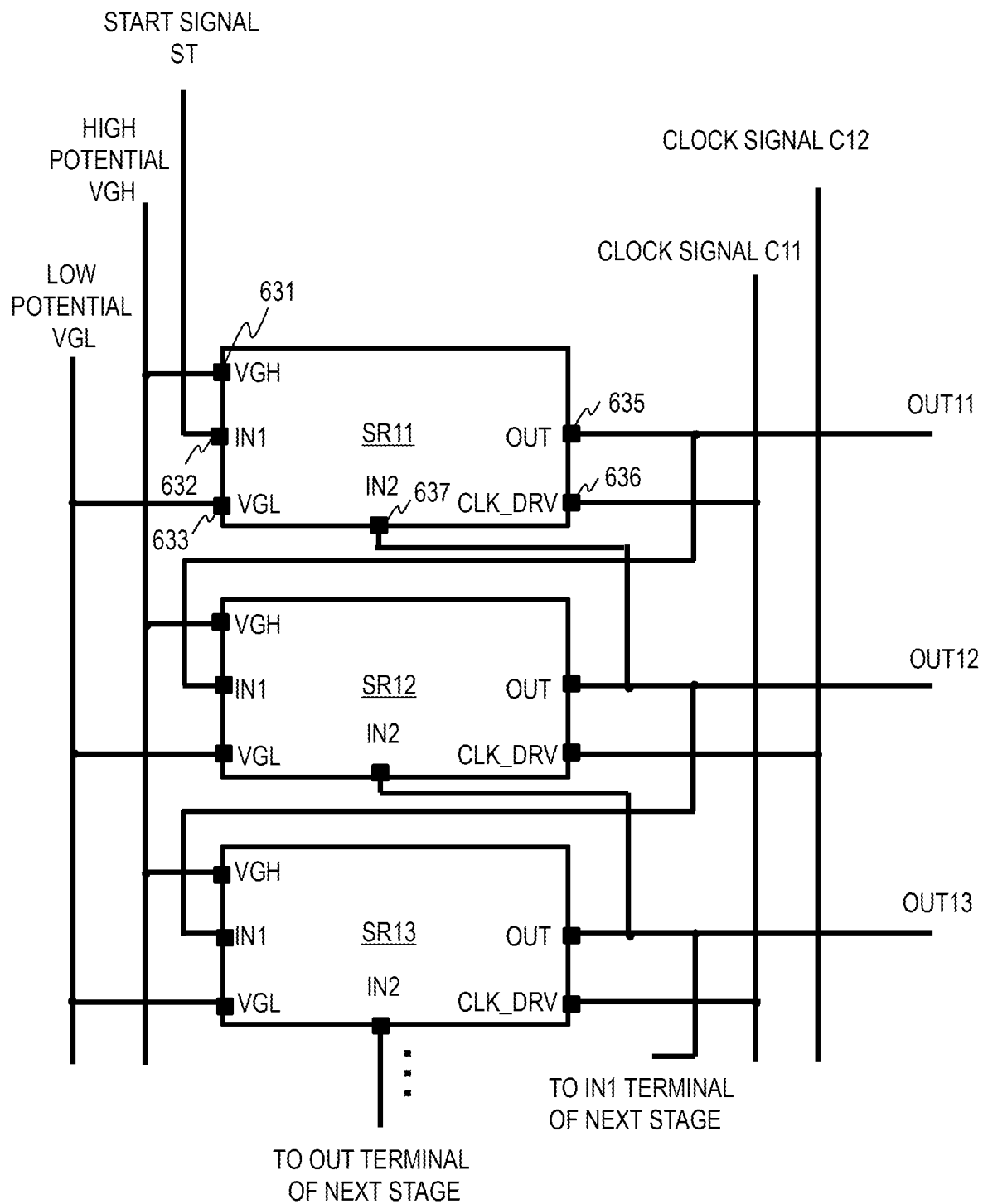
FIG. 13 illustrates a configuration of a part of a shift register including the shift register unit described with reference to FIGS. 11 and 12.

FIG. 13 illustrates a configuration of a part of a shift register including a shift register unit described with reference to FIGS. 11 and 12. FIG. 13 illustrates a shift register unit SR11 of the first stage, a shift register unit SR12 of the second stage, and a shift register unit SR13 of the third stage. Each of the shift register units SR11, SR12, and SR13 can have the circuit configuration described with reference to FIGS. 11 and 12. The shift register can include n shift register units (n is a positive integer) successively connected in accordance with the design.

Each shift register unit includes a plurality of signal terminals, specifically, a VGH terminal 631, an IN1 terminal 632, a VGL terminal 633, an OUT terminal 635, a CLK_DRV terminal 636, and an IN2 terminal 637. In FIG. 13, the terminals of the first shift register unit SR11 are provided with reference signs, by way of example.

The OUT terminal 635 outputs the output signal OUT in FIG. 12. The VGH terminal 631 is supplied with the constant high power-supply potential VGH. The VGL terminal 633 is supplied with the constant low power-supply potential VGL. The signal to be input to the IN1 terminal 632 is the input signal IN1 in FIG. 12. The signal to be input to the CLK_DRV terminal 636 is the clock signal CLK_DRV in FIG. 12. The signal to be input to the IN2 terminal 637 is the input signal IN2 in FIG. 12. Some of the input signals for a shift register unit are supplied from the driver IC 134.

The shift register units SR11, SR12, and SR13 output output signals OUT11, OUT12, and OUT13, respectively, from their OUT terminals 635. Each output signal is supplied to the gate of the TFT 24 in a pixel circuit and further, to the IN1 terminal 632 of the next shift register unit and the IN2 terminal 637 of the previous shift register unit. The IN1 terminal 632 of the first shift register unit SR11 is supplied with a start signal ST.

The CLK_DRV terminal 636 of the (2k−1)th stage (k is a positive integer) is supplied with a clock signal C11 and the CLK_DRV terminal 636 of the 2k-th stage is supplied with a clock signal C12. The clock signals C11 and C12 vary in the same manner as the clock signal CLK_DRV described with reference to FIG. 12 in the shift register units.

Figure 14:
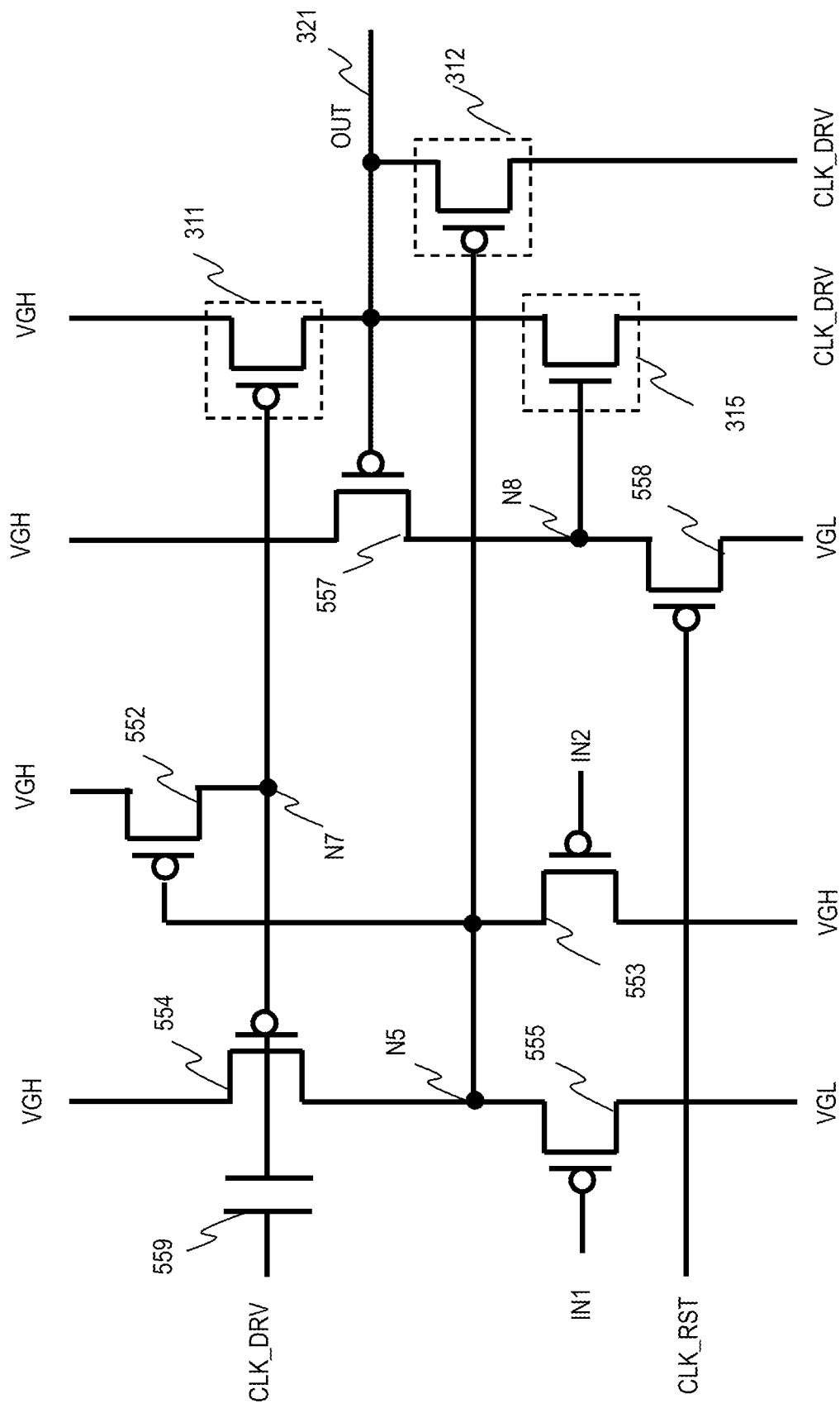
FIG. 14 illustrates still another configuration example of a shift register unit.

Another configuration example of a shift register unit is described. FIG. 14 illustrates another configuration example of a shift register unit. The following mainly describes differences from the configuration example in FIG. 11. The shift register unit in FIG. 14 includes p-type TFTs 557 and 558 in addition to the configuration example in FIG. 11. The gate of the n-type pull-down TFT 315 is not connected with the gate of the p-type pull-up TFT 311. A node N7 is provided on the line connecting the gate of the p-type TFT 554 and the gate of the p-type pull-up TFT 311.

The gate of the p-type TFT 557 is connected with the output line 321 and they are at the same potential. A source/drain of the p-type TFT 557 is supplied with the high power-supply potential VGH. The other source/drain of the p-type TFT 557 is connected with the gate of the n-type pull-down TFT 315 via a node N8 and they are at the same potential.

The gate of the p-type TFT 558 is supplied with a clock signal CLK_RST. A source/drain of the p-type TFT 558 is supplied with the low power-supply potential VGL. The other source/drain of the p-type TFT 558 is connected with the gate of the n-type pull-down TFT 315 via the node N8 and they are at the same potential.

Figure 15:
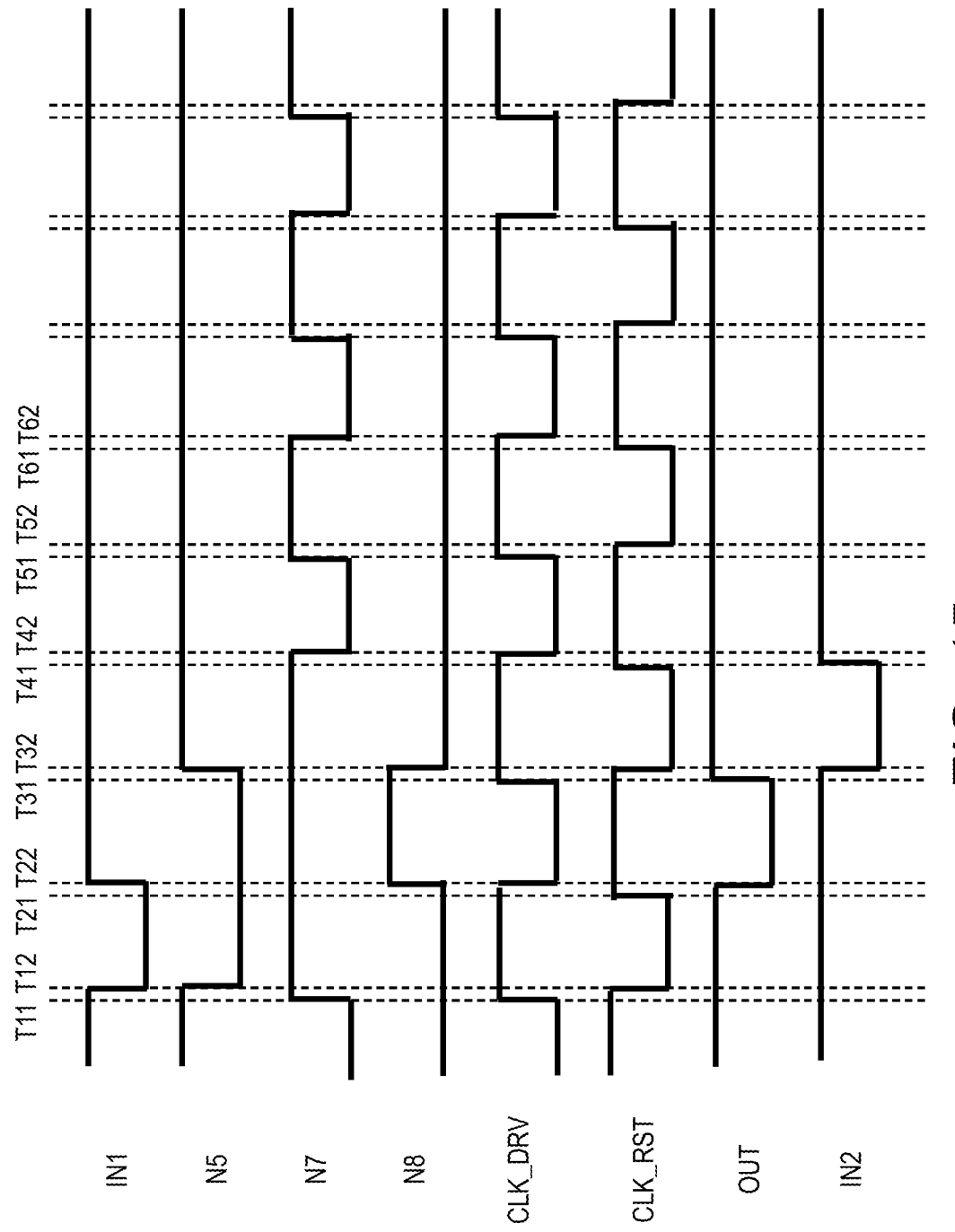
FIG. 15 is a timing chart of the circuit illustrated in FIG. 14.

FIG. 15 is a timing chart of the circuit illustrated in FIG. 14. Compared to the timing chart of FIG. 12, temporal variation of the potential at the node N6 is excluded and temporal variations of the clock signal CLK_RST and the potentials at the nodes N7 and N8 are added.

First, the state immediately before a time T11 is described. The input signal IN1 is H; the clock signal CLK_DRV is L; the clock signal CLK_RST is H; and the input signal IN2 is H. The potential at the node N5 is H; the potential at the node N7 is L; and the potential at the node N8 is L.

The p-type pull-down TFT 312 is OFF. The p-type TFTs 553 and 555 are OFF. The p-type TFT 558 is OFF. The p-type pull-up TFT 311 and the p-type TFT 554 are ON and the n-type pull-down TFT 315 is OFF. The output signal OUT is H and the p-type TFT 557 is OFF.

Next, operation of the elements at the time T11 and a time T12 immediately after the time T11 is described. The clock signal CLK_DRV changes from L to H at the time T11. The potential at the node N7 changes from L to H in response to the change of the clock signal CLK_DRV. The p-type TFT 554 and the p-type pull-up TFT 311 turn OFF.

At the time T12, the input signal IN1 changes from H to L and the clock signal CLK_RST changes from H to L. In response to the change of the clock signal CLK_RST, the p-type TFT 558 turns ON. The potential at the node N8 remains at L and the n-type pull-down TFT 315 remains OFF.

In response to the change of the input signal IN1, the p-type TFT 555 turns ON and the potential at the node N5 changes from H to L. The p-type pull-down TFT 312 turns ON. Since the clock signal CLK_DRV is H, the output signal OUT keeps H.

At a time T21 later than the time T12, the clock signal CLK_RST changes from L to H. The p-type TFT 558 turns OFF in response to the change of the clock signal CLK_RST. The potential at the node N8 is kept at L and the n-type pull-down TFT 315 remains OFF.

At a time T22 immediately after the time T21, the input signal IN1 changes from L to H and the clock signal CLK_DRV changes from H to L. In response to the change of the input signal IN1, the p-type TFT 555 turns OFF. The p-type TFT 553 remains OFF. The node N5 is in a floating state and its potential is kept at L. Accordingly, the p-type pull-down TFT 312 remains ON.

Although the clock signal CLK_DRV changes to L as described above, the potential at the node N7 is kept at H because of the capacitor 559 and the p-type TFT 552 being ON. Accordingly, the p-type TFT 554 and the p-type pull-up TFT 311 remain OFF. Since the clock signal CLK_DRV changes from H to L, the output signal OUT changes from H to L. The p-type TFT 557 turns ON; the potential at the node N8 changes from L to H; and the n-type pull-down TFT 315 turns ON.

At a time T31 later than the time T22, the clock signal CLK_DRV changes from L to H. The potential at the node N7 is kept at H and the p-type TFT 554 and the p-type pull-up TFT 311 remain OFF. The potential at the node N5 is kept at L and the potential at the node N8 is kept at H. Accordingly, the p-type pull-down TFT 312 and the n-type pull-down TFT 315 remain ON.

The output signal OUT changes from L to H together with the change of the clock signal CLK_DRV from L to H. In response to the change of the output signal OUT, the p-type TFT 557 turns OFF. The node N8 becomes in a floating state and its potential remains at H.

At a time T32 immediately after the time T31, the input signal IN2 changes from H to L and the clock signal CLK_RST changes from H to L. In response to the change of the input signal IN2 from H to L, the p-type TFT 553 turns ON and the potential at the node N5 changes from L to H. The p-type TFT 552 and the p-type pull-down TFT 312 turn OFF in response to the change of the potential at the node N5.

In response to the change of the clock signal CLK_RST from H to L, the p-type TFT 558 turns ON. The potential at the node N8 changes from H to L and the n-type pull-down TFT 315 turns OFF. The output line 321 becomes a floating state and the output signal OUT is kept at H.

At a time T41 later than the time T32, the input signal IN2 changes from L to H and the clock signal CLK_RST changes from L to H. In response to the change of the input signal IN2 from L to H, the p-type TFT 553 turns OFF. The node N5 becomes a floating state and its potential is kept at H. In response to the change of the clock signal CLK_RST from L to H, the p-type TFT 558 turns OFF. The node N8 becomes a floating state and its potential is kept at L.

At a time T42 immediately after the time T41, the clock signal CLK_DRV changes from H to L. In response to the change of the clock signal CLK_DRV from H to L, the potential at the node N7 changes from H to L. In response, the p-type TFT 554 and the p-type pull-up TFT 311 turn ON. The potential at the node N5 is kept at H. The node N8 is in a floating state and its potential is kept at L. Accordingly, the pull-down TFTs 312 and 315 remain OFF and as a result, the output signal OUT remains at H.

At a time T51 later than the time T42, the clock signal CLK_DRV changes from L to H. In response, the potential at the node N7 changes from L to H. In response to the change of the potential at the node N7 from L to H, the p-type TFT 554 and the p-type pull-up TFT 311 turn OFF. The node N5 is in a floating state and its potential remains at H. The node N8 is in a floating state and its potential is kept at L. Accordingly, the pull-down TFTs 312 and 315 remain OFF. The output line 321 is in a floating state and the output signal OUT remains at H.

At a time T52 immediately after the time T51, the clock signal CLK_RST changes from H to L. The P-type TFT 558 turns ON. The potential at the node N8 is kept at L. The other TFTs including the n-type pull-down TFT 315 remain OFF. The output line 321 is in a floating state and the output signal OUT remains at H.

At a time T61 later than the time T52, the clock signal CLK_RST changes from L to H. The p-type TFT 558 turns OFF. The node N8 becomes a floating state and its potential is kept at L. All the other TFTs remain OFF. The output line 321 is in a floating state and the output signal OUT remains at H.

At a time T62 immediately after the time T61, the clock signal CLK_DRV changes from H to L. In response, the potential at the node N7 changes from H to L. In response to the change of the potential at the node N7 from H to L, the p-type TFT 554 and the p-type pull-up TFT 311 turn ON. The other TFTs remain OFF. The p-type pull-up TFT 311 supplies the potential VGH to the output line 321 and the output signal OUT remains at H.

Subsequent to the time T62, the operation from the time T42 to the time T62 is repeated until the next frame begins. As described above, the p-type TFT 554 and the p-type pull-up TFT 311 turn ON and OFF during the period from the time T42 to the time T62. These two p-type TFTs are ON from the time T42 to the time T51 and OFF from the time T51 to the time T62 (T42). The configuration of turning ON and OFF two p-type TFTs 554 and 311 synchronously with the clock signal CLK_DRV lightens the positive Vg stress and diminishes the instability of the circuit operation caused by Vt shift.

Figure 16:
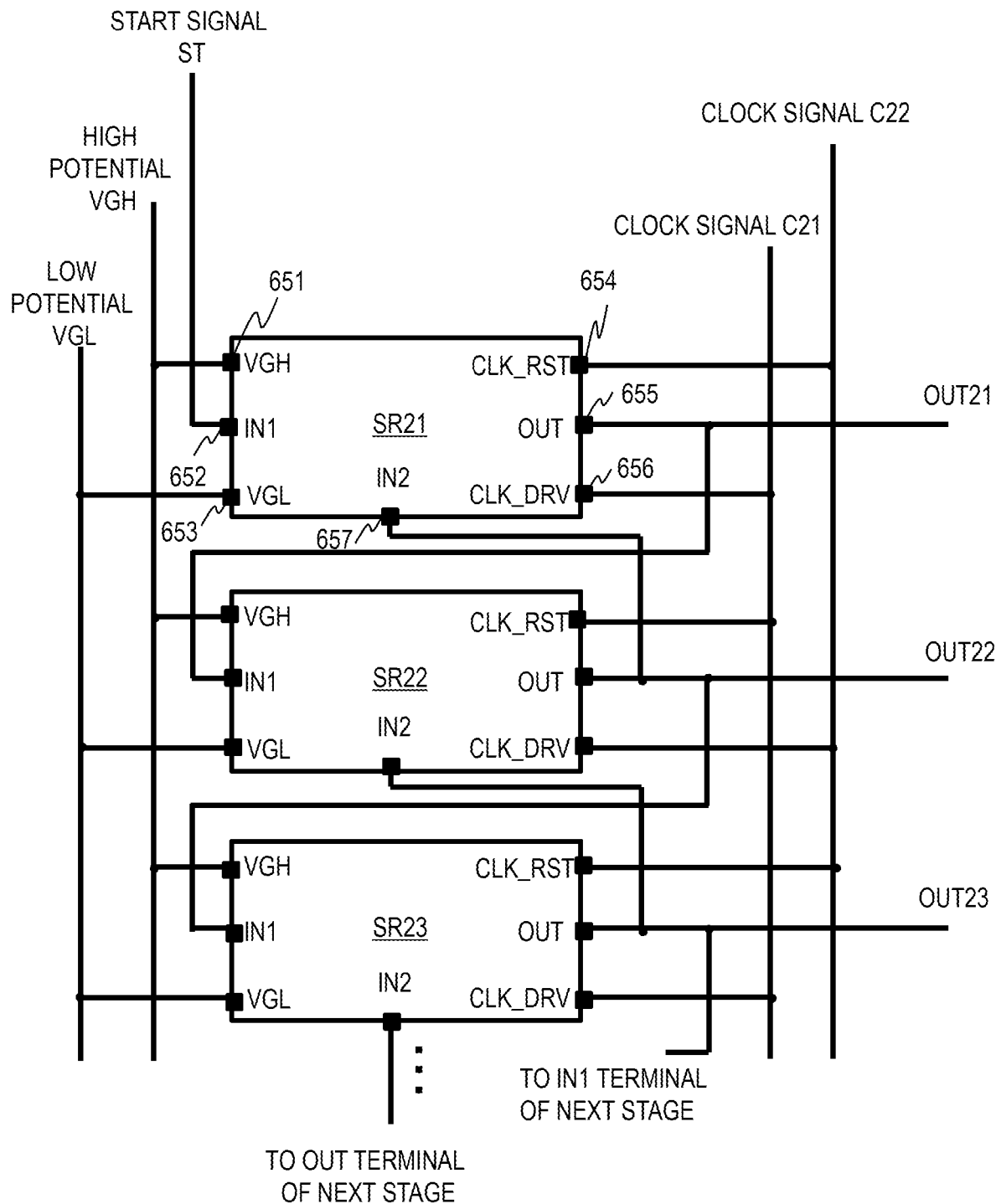
FIG. 16 illustrates a configuration of a part of a shift register including the shift register unit described with reference to FIGS. 14 and 15.

FIG. 16 illustrates a configuration of a part of a shift register including a shift register unit described with reference to FIGS. 14 and 15. FIG. 16 illustrates a shift register unit SR21 of the first stage, a shift register unit SR22 of the second stage, and a shift register unit SR23 of the third stage. Each of the shift register units SR21, SR22, and SR23 can have the circuit configuration described with reference to FIGS. 14 and 15. The shift register can include n shift register units (n is a positive integer) successionally connected in accordance with the design.

Each shift register unit includes a plurality of signal terminals, specifically, a VGH terminal 651, an IN1 terminal 652, a VGL terminal 653, a CLK_RST terminal 654, an OUT terminal 655, a CLK_DRV terminal 656, and an IN2 terminal 657. In FIG. 16, the terminals of the first shift register unit SR21 are provided with reference signs, by way of example.

The OUT terminal 655 outputs the output signal OUT in FIG. 14. The VGH terminal 651 is supplied with the constant high power-supply potential VGH. The VGL terminal 653 is supplied with the constant low power-supply potential VGL. The signal to be input to the IN1 terminal 652 is the input signal IN1 in FIG. 15. The signal to be input to the CLK_RST terminal 654 is the clock signal CLK_RST in FIG. 15. The signal to be input to the CLK_DRV terminal 656 is the clock signal CLK_DRV in FIG. 15. The signal to be input to the IN2 terminal 657 is the input signal IN2 in FIG. 15. Some of the input signals for a shift register unit are supplied from the driver IC 134.

The shift register units SR21, SR22, and SR23 output output signals OUT21, OUT22, and OUT23, respectively, from their OUT terminals 655. The output signal is supplied to the gate of the TFT 24 in a pixel circuit and further, to the IN1 terminal 652 of the next shift register unit and the IN2 terminal 657 of the previous shift register unit. The IN1 terminal 652 of the first shift register unit SR21 is supplied with a start signal ST.

The CLK_DRV terminal 656 of the (2k−1)th stage (k is a positive integer) is supplied with a clock signal C21 and the CLK_DRV terminal 656 of the 2k-th stage is supplied with a clock signal C22. The CLK_RST terminal 654 of the (2k−1)th stage is supplied with the clock signal C22 and the CLK_RST terminal 654 of the 2k-th stage is supplied with the clock signal C21. The clock signals C21 and C22 vary in the same manner as the clock signal CLK_DRV described with reference to FIG. 15 in the shift register units.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A shift register comprising:
   a plurality of successionally connected shift register units configured to output output signals one after another,
   wherein each of the plurality of shift register units includes a circuit configured to output an output signal from an output line,
   wherein the circuit includes:
      a first output signal supply line;
      a second output signal supply line;
      an output line;
      a first p-type thin-film transistor disposed between the first output signal supply line and the output line and configured to turn ON and OFF;
      an n-type thin-film transistor disposed between the second output signal supply line and the output line and configured to turn ON and OFF; and
      a second p-type thin-film transistor disposed between the second output signal supply line and the output line and configured to turn ON and OFF,
   wherein the n-type thin-film transistor and the second p-type thin-film transistor are configured to be OFF to output a signal on the first output signal supply line to the output line when the first p-type thin-film transistor is ON,
   wherein the first p-type thin-film transistor is configured to be OFF to supply a signal on the second output signal supply line to the output line when the n-type thin-film transistor and the second p-type thin-film transistor are ON,
   wherein each of the plurality of shift register units further includes:
      a first control switch thin-film transistor; and
      a second control switch thin-film transistor,
   wherein the first control switch thin-film transistor and the second control switch thin-film transistor are of the same conductive type and configured to be controlled to turn ON/OFF in accordance with the same input signal,
   wherein one of the first control switch thin-film transistor and the second control switch thin-film transistor is configured to supply a gate signal to the first p-type thin-film transistor and the n-type thin-film transistor when the one control switch thin-film transistor is ON, and
   wherein the other one of the first control switch thin-film transistor and the second control switch thin-film transistor is configured to supply a gate signal to the second p-type thin-film transistor when the other control switch thin-film transistor is ON.

2. The shift register according to claim 1, wherein the first p-type thin-film transistor and the second p-type thin-film transistor are p-type polysilicon thin-film transistors.

3. The shift register according to claim 2,
   wherein a first gate signal is supplied to a gate of the first p-type thin-film transistor and a gate of the n-type thin-film transistor, and
   wherein a second gate signal that shows temporal variation opposite to the first gate signal is supplied to a gate of the second p-type thin-film transistor.

4. The shift register according to claim 1,
   wherein the second p-type thin-film transistor is configured to increase a potential of the output line to a potential higher than a potential of the second output signal supply line by a predetermined voltage, and
   wherein the n-type thin-film transistor is configured to reduce the potential of the output line from the potential higher than the potential of the second output signal supply line by the predetermined voltage to the potential of the second output signal supply line.

5. The shift register according to claim 1,
   wherein one of the first output signal supply line and the second output signal supply line is configured to supply a constant potential signal, and
   wherein the other one of the first output signal supply line and the second output signal supply line is configured to supply a signal cyclically changing between a low potential and a high potential.

6. The shift register according to claim 1,
   wherein each of the plurality of shift register units further includes a third control switch thin-film transistor,
   wherein a gate of the first p-type thin-film transistor and a gate of the n-type thin-film transistor are supplied with a first gate signal,
   wherein a gate of the second p-type thin-film transistor is supplied with a second gate signal,
   wherein a gate of the third control switch thin-film transistor is supplied with one of the first gate signal and the second gate signal, and
   wherein the third control switch thin-film transistor is configured to supply the other one of the first gate signal and the second gate signal when the third control switch thin-film transistor is ON.

7. The shift register according to claim 6,
wherein each of the plurality of shift register units further includes a fourth control switch thin-film transistor,
wherein a gate of the first p-type thin-film transistor and a gate of the n-type thin-film transistor are supplied with a first gate signal,
wherein a gate of the second p-type thin-film transistor is supplied with a second gate signal,
wherein the fourth control switch thin-film transistor is in a diode-connected state,
wherein a drain of the fourth control switch thin-film transistor is supplied with a signal changing periodically, and
wherein the fourth control switch thin-film transistor is configured to supply one of the first gate signal and the second gate signal when the fourth control switch thin-film transistor is in a forward-biased state.

8. The shift register according to claim 1,
wherein each of the plurality of shift register units further includes:
a third control switch thin-film transistor; and
a fourth control switch thin-film transistor,
wherein a gate of the first p-type thin-film transistor and a gate of the n-type thin-film transistor are supplied with a first gate signal,
wherein a gate of the second p-type thin-film transistor is supplied with a second gate signal,
wherein a gate of the third control switch thin-film transistor is supplied with one of the first gate signal and the second gate signal,
wherein the third control switch thin-film transistor is configured to supply the other one of the first gate signal and the second gate signal when the third control switch thin-film transistor is ON,
wherein the fourth control switch thin-film transistor is in a diode-connected state,
wherein a drain of the fourth control switch thin-film transistor is supplied with a signal changing periodically, and
wherein the fourth control switch thin-film transistor is configured to supply one of the first gate signal and the second gate signal when the fourth control switch thin-film transistor is in a forward-biased state.

9. A shift register comprising:
a plurality of successively connected shift register units configured to output output signals one after another,
wherein each of the plurality of shift register units includes a circuit configured to output an output signal from an output line,
wherein the circuit includes:
a first output signal supply line;
a second output signal supply line;
an output line;
a first p-type thin-film transistor disposed between the first output signal supply line and the output line and configured to turn ON and OFF;
an n-type thin-film transistor disposed between the second output signal supply line and the output line and configured to turn ON and OFF; and
a second p-type thin-film transistor disposed between the second output signal supply line and the output line and configured to turn ON and OFF,
wherein the n-type thin-film transistor and the second p-type thin-film transistor are configured to be OFF to output a signal on the first output signal supply line to the output line when the first p-type thin-film transistor is ON,
wherein the first p-type thin-film transistor is configured to be OFF to supply a signal on the second output signal supply line to the output line when the n-type thin-film transistor and the second p-type thin-film transistor are ON,
wherein each of the plurality of shift register units is configured to output signal pulses at an L-level,
wherein the first output signal supply line supplies a constant H-level signal, and
wherein the first p-type thin-film transistor is configured to repeat turning ON and OFF during a predetermined period within a frame where the output line is outputting the H-level signal after outputting a signal pulse at the L-level.

10. The shift register according to claim 9,
wherein the first p-type thin-film transistor and the n-type thin-film transistor are configured to turn ON/OFF in accordance with a clock signal, and
wherein the second output signal supply line supplies the clock signal.

11. The shift register according to claim 9,
wherein the first p-type thin-film transistor is configured to turn ON/OFF in accordance with a clock signal, and
wherein the n-type thin-film transistor and the second p-type thin-film transistor are OFF during the predetermined period.

12. The shift register according to claim 9, wherein the first p-type thin-film transistor and the second p-type thin-film transistor are p-type polysilicon thin-film transistors.

13. The shift register according to claim 12,
wherein a first gate signal is supplied to a gate of the first p-type thin-film transistor and a gate of the n-type thin-film transistor, and
wherein a second gate signal that shows temporal variation opposite to the first gate signal is supplied to a gate of the second p-type thin-film transistor.

14. The shift register according to claim 9,
wherein the second p-type thin-film transistor is configured to increase a potential of the output line to a potential higher than a potential of the second output signal supply line by a predetermined voltage, and
wherein the n-type thin-film transistor is configured to reduce the potential of the output line from the potential higher than the potential of the second output signal supply line by the predetermined voltage to the potential of the second output signal supply line.

15. The shift register according to claim 9,
wherein one of the first output signal supply line and the second output signal supply line is configured to supply a constant potential signal, and
wherein the other one of the first output signal supply line and the second output signal supply line is configured to supply a signal cyclically changing between a low potential and a high potential.

16. The shift register according to claim 9,
wherein each of the plurality of shift register units further includes a third control switch thin-film transistor,
wherein a gate of the first p-type thin-film transistor and a gate of the n-type thin-film transistor are supplied with a first gate signal,
wherein a gate of the second p-type thin-film transistor is supplied with a second gate signal, wherein a gate of the third control switch thin-film transistor is supplied with one of the first gate signal and the second gate signal, and wherein the third control switch thin-film transistor is configured to supply the other one of the first gate signal and the second gate signal when the third control switch thin-film transistor is ON.

* * * * *